US012562753B2

(12) United States Patent
Cooper et al.

(10) Patent No.: US 12,562,753 B2
(45) Date of Patent: Feb. 24, 2026

(54) SYSTEM AND METHOD FOR MULTI-TYPE DATA COMPRESSION OR DECOMPRESSION WITH A VIRTUAL MANAGEMENT LAYER

(71) Applicant: AtomBeam Technologies Inc., Moraga, CA (US)

(72) Inventors: Joshua Cooper, Columbia, SC (US); Charles Yeomans, Orinda, CA (US); Zhu Li, Overland Park, KS (US); Brian Galvin, Silverdale, WA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

(21) Appl. No.: 18/970,934

(22) Filed: Dec. 6, 2024

(65) Prior Publication Data

US 2025/0096815 A1      Mar. 20, 2025

Related U.S. Application Data

(63) Continuation-in-part of application No. 18/657,719, filed on May 7, 2024, now Pat. No. 12,166,506, (Continued)

(51) Int. Cl.
| | |
|---|---|
| G06F 16/215 | (2019.01) |
| G06N 20/00 | (2019.01) |
| H03M 7/30 | (2006.01) |

(52) U.S. Cl.
CPC ........ H03M 7/3059 (2013.01); G06F 16/215 (2019.01); G06N 20/00 (2019.01); H03M 7/6005 (2013.01)

(58) Field of Classification Search
CPC .. H03M 7/3059; H03M 7/6005; G06N 20/00; G06F 16/215
See application file for complete search history.

(56) References Cited

U.S. PATENT DOCUMENTS

| | | |
|---|---|---|
| 7,103,538 B1 | 9/2006 | Gao |
| 7,519,228 B2 | 4/2009 | Cho et al. |

(Continued)

FOREIGN PATENT DOCUMENTS

| | | | | |
|---|---|---|---|---|
| WO | WO-2016186563 A1 * | 11/2016 | ............... | G06F 3/06 |
| WO | WO-2021101798 A1 * | 5/2021 | ......... | G06F 12/0292 |

*Primary Examiner* — Yuk Ting Choi
(74) *Attorney, Agent, or Firm* — Galvin Patent Law LLC; Brian R. Galvin

(57) ABSTRACT

A system and methods for multi-type data compression or decompression with a virtual management layer in a distributed computing environment, comprising. It incorporates a virtual management layer to organize incoming data types and allocate compression or decompression tasks across multiple computing devices, selecting techniques best suited for particular data types. Associated data sets may be flagged prior to processing, ensuring preservation of relationships even when compressed or decompressed on different devices. This distributed approach allows efficient parallel processing of multiple data types, improving scalability and performance. A load balancing module optimizes task distribution based on available resources and processing requirements. The system enables each data type to be processed using the most efficient technique while maintaining associations between related data sets, effectively handling larger volumes of diverse data.

12 Claims, 38 Drawing Sheets

Related U.S. Application Data which is a continuation-in-part of application No. 18/423,287, filed on Jan. 25, 2024, now Pat. No. 12,218,696, and a continuation-in-part of application No. 18/410,980, filed on Jan. 11, 2024, now Pat. No. 12,068,761, which is a continuation-in-part of application No. 18/537,728, filed on Dec. 12, 2023, now Pat. No. 12,058,333, said application No. 18/423,287 is a continuation of application No. 18/501,987, filed on Nov. 4, 2023, now Pat. No. 11,967,974, which is a continuation-in-part of application No. 18/190,044, filed on Mar. 24, 2023, now Pat. No. 11,831,343, which is a continuation-in-part of application No. 17/875,201, filed on Jul. 27, 2022, now Pat. No. 11,700,013, and a continuation-in-part of application No. 17/727,913, filed on Apr. 25, 2022, now Pat. No. 11,620,051, said application No. 17/875,201 is a continuation of application No. 17/514,913, filed on Oct. 29, 2021, now Pat. No. 11,424,760, and a continuation of application No. 17/458,747, filed on Aug. 27, 2021, now Pat. No. 11,422,978, said application No. 17/727,913 is a continuation of application No. 17/404,699, filed on Aug. 17, 2021, now Pat. No. 11,385,794, said application No. 17/514,913 is a continuation-in-part of application No. 17/404,699, filed on Aug. 17, 2021, now Pat. No. 11,385,794, said application No. 17/458,747 is a continuation-in-part of application No. 16/923,039, filed on Jul. 7, 2020, now Pat. No. 11,232,076, which is a continuation-in-part of application No. 16/716,098, filed on Dec. 16, 2019, now Pat. No. 10,706,018, which is a continuation of application No. 16/455,655, filed on Jun. 27, 2019, now Pat. No. 10,509,771, said application No. 17/404,699 is a continuation-in-part of application No. 16/455,655, filed on Jun. 27, 2019, now Pat. No. 10,509,771, which is a continuation-in-part of application No. 16/200,466, filed on Nov. 26, 2018, now Pat. No. 10,476,519, which is a continuation-in-part of application No. 15/975,741, filed on May 9, 2018, now Pat. No. 10,303,391.

(60) Provisional application No. 63/388,411, filed on Jul. 12, 2022, provisional application No. 63/027,166, filed on May 19, 2020, provisional application No. 62/926,723, filed on Oct. 28, 2019, provisional application No. 62/578,824, filed on Oct. 30, 2017.

(56) References Cited

U.S. PATENT DOCUMENTS

| | | | | |
|---|---|---|---|---|
| 7,629,922 | B2 | 12/2009 | Winstead et al. | |
| 7,876,257 | B2 | 1/2011 | Vetro et al. | |
| 8,533,456 | B2 | 9/2013 | Kholidy | |
| 10,133,500 | B2 * | 11/2018 | Vishniac | G06F 3/061 |
| | | | | 707/693 |
| 10,785,545 | B2 | 9/2020 | Metzler et al. | |
| 10,936,562 | B2 * | 3/2021 | Arye | G06F 16/245 |
| | | | | 707/693 |
| 11,656,353 | B2 | 5/2023 | Li et al. | |
| 11,662,953 | B2 * | 5/2023 | Sato | G06F 3/0661 |
| | | | | 711/154 |
| 2004/0249870 | A1 * | 12/2004 | Jeevanjee | G06F 16/275 |
| | | | | 707/693 |
| 2014/0114936 | A1 * | 4/2014 | Araki | G06F 3/0608 |
| | | | | 707/693 |
| 2017/0199707 | A1 | 7/2017 | Varghese et al. | |
| 2018/0196609 | A1 | 7/2018 | Niesen | |
| 2021/0109974 | A1 * | 4/2021 | Shekhar | G06F 3/064 |
| | | | | 707/693 |
| 2024/0291503 | A1 * | 8/2024 | Cooper | G06N 20/00 |
| | | | | 707/693 |

* cited by examiner

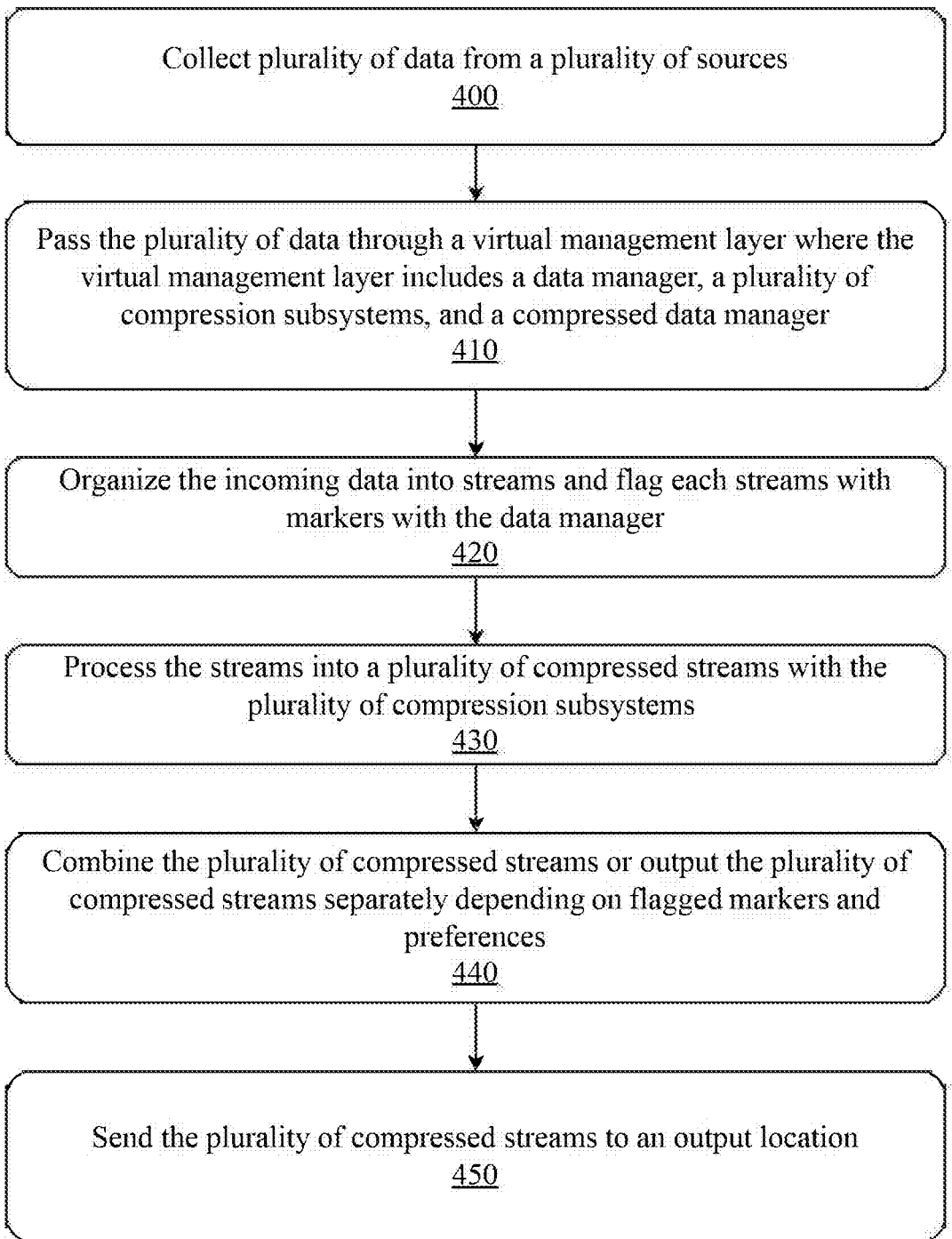

Collect plurality of data from a plurality of sources
400

Pass the plurality of data through a virtual management layer where the virtual management layer includes a data manager, a plurality of compression subsystems, and a compressed data manager
410

Organize the incoming data into streams and flag each streams with markers with the data manager
420

Process the streams into a plurality of compressed streams with the plurality of compression subsystems
430

Combine the plurality of compressed streams or output the plurality of compressed streams separately depending on flagged markers and preferences
440

Send the plurality of compressed streams to an output location
450

FIG. 4

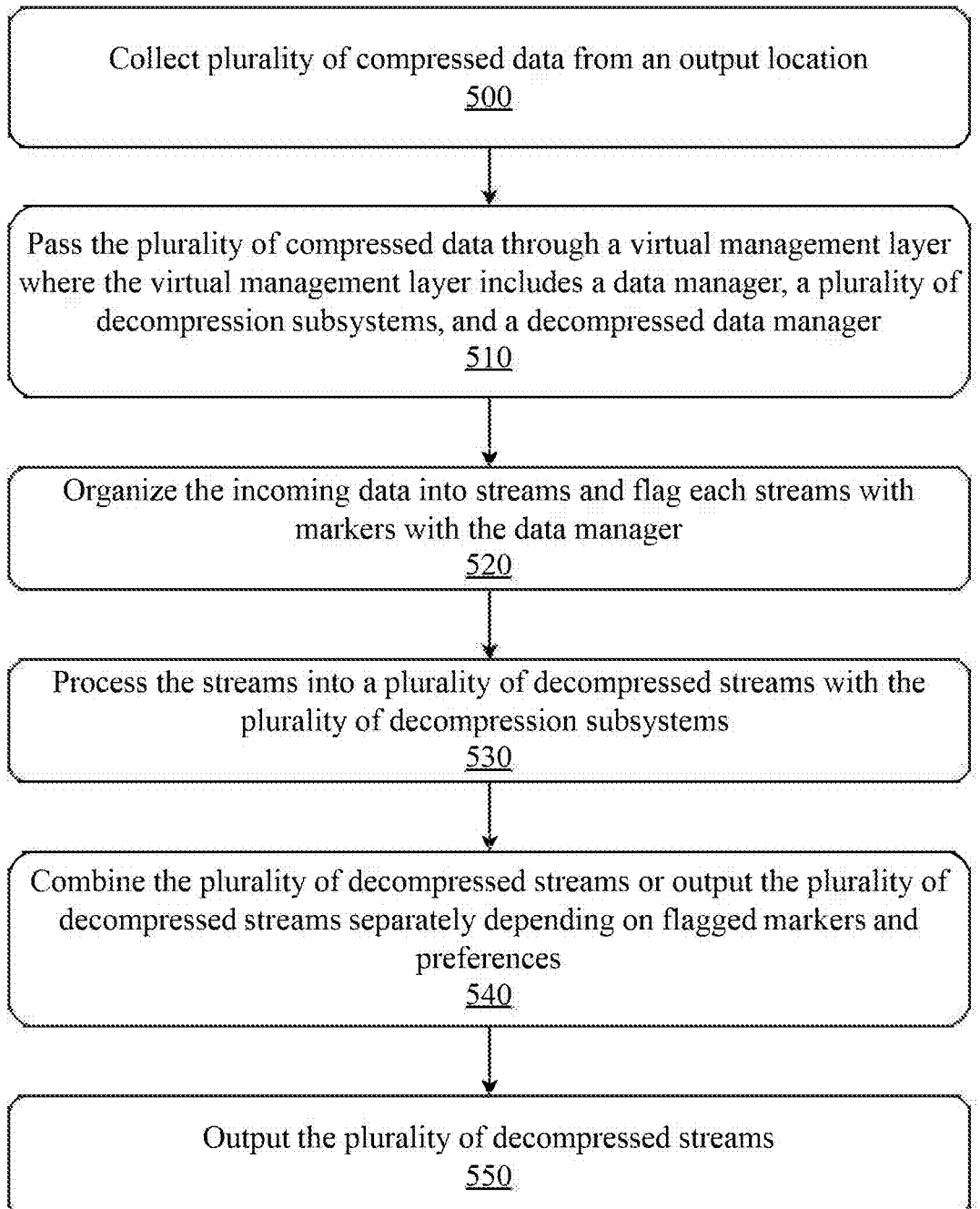

Collect plurality of compressed data from an output location
500

Pass the plurality of compressed data through a virtual management layer
where the virtual management layer includes a data manager, a plurality of
decompression subsystems, and a decompressed data manager
510

Organize the incoming data into streams and flag each streams with
markers with the data manager
520

Process the streams into a plurality of decompressed streams with the
plurality of decompression subsystems
530

Combine the plurality of decompressed streams or output the plurality of
decompressed streams separately depending on flagged markers and
preferences
540

Output the plurality of decompressed streams
550

FIG. 5

Data retrieval request
802

800

Data Reconstruction Engine
801

Data Request
Receiver
803

Codewords in
from storage
805

Codeword
Retriever
804

Data Assembler
308

Data out
to user
809

Reference codes
out to
library manager
806

Sourceblocks in
from library manager
807

Receive request for data
1401

Retrieve codewords
1402

Pass reference codes to library management module
1403

Receive sourceblocks from library management module
1404

Assemble sourceblocks into original data
1405

Send data out to requestor
1406

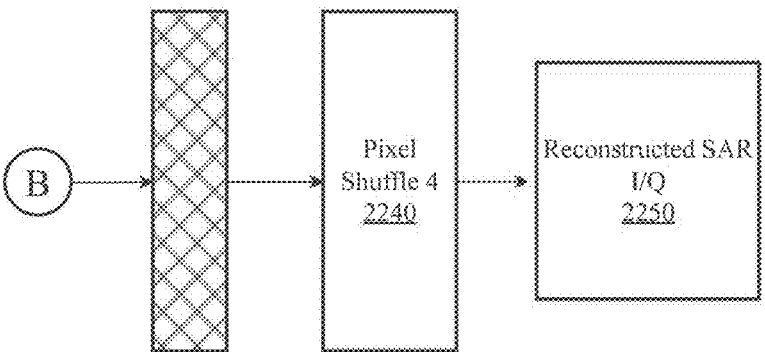
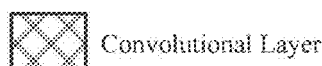 Convolutional Layer
FIG. 22B

Receive a raw complex-valued SAR image
2401

Preprocess the SAR image
2402

Quantize the preprocessed SAR image
2403

Compress the quantized SAR data
2404

Compact the compressed SAR data
2405

Receive a bit stream comprising compressed and compacted
complex-valued SAR image data
2501

De-compact the bit stream
2502

Decompress the bit stream
2503

Feed the de-compressed bit stream as input into an AI deblocking
network
2504

De-quantize the output of the AI deblocking network
2505

Reconstruct the original complex-valued SAR image using the
dequantized bit stream
2506

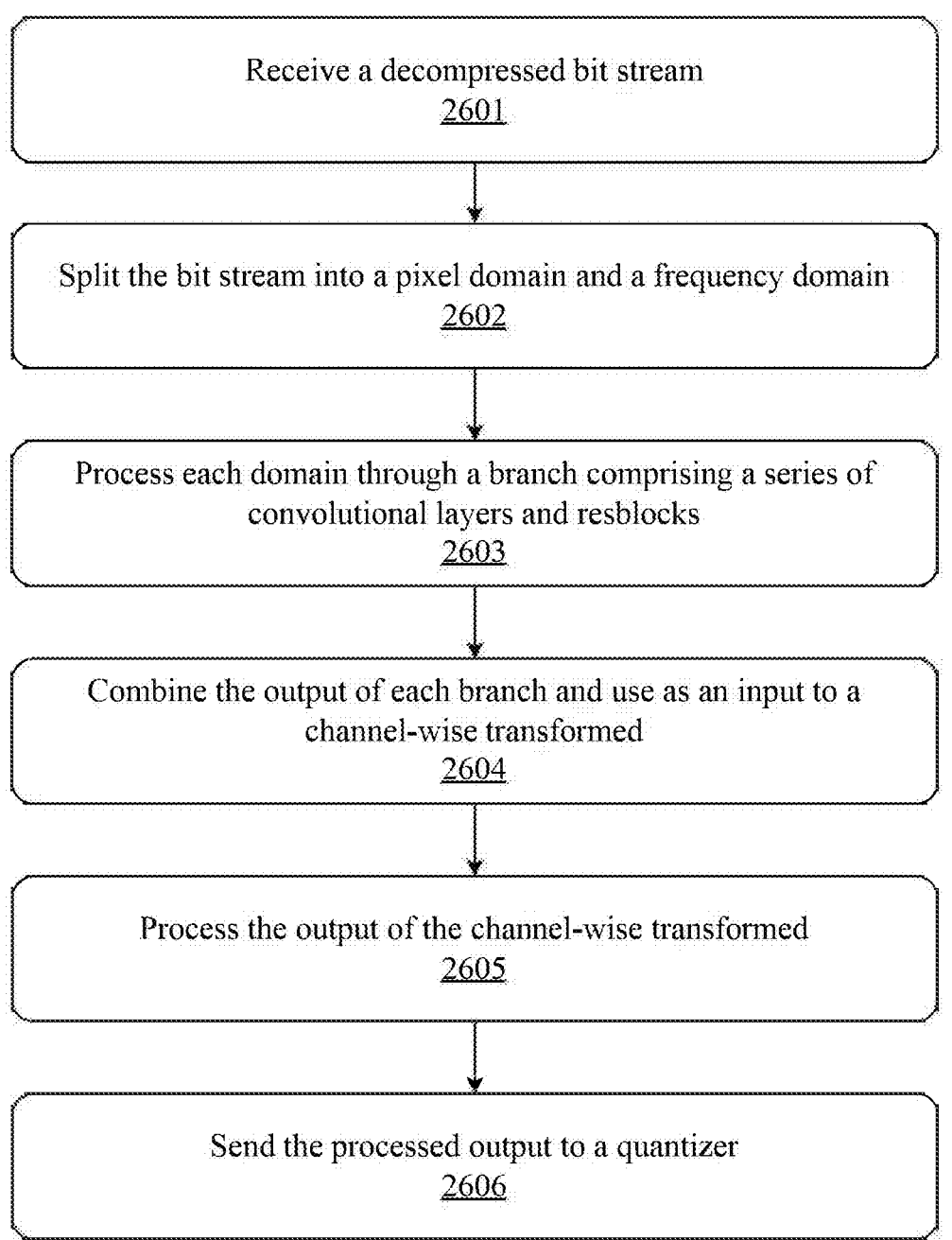

Receive a decompressed bit stream
2601

Split the bit stream into a pixel domain and a frequency domain
2602

Process each domain through a branch comprising a series of
convolutional layers and resblocks
2603

Combine the output of each branch and use as an input to a
channel-wise transformed
2604

Process the output of the channel-wise transformed
2605

Send the processed output to a quantizer
2606

FIG. 26

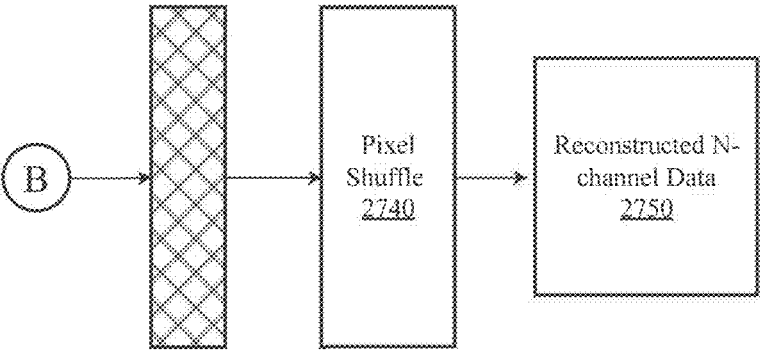
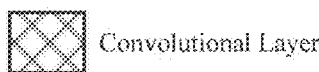
Convolutional Layer
FIG. 27B

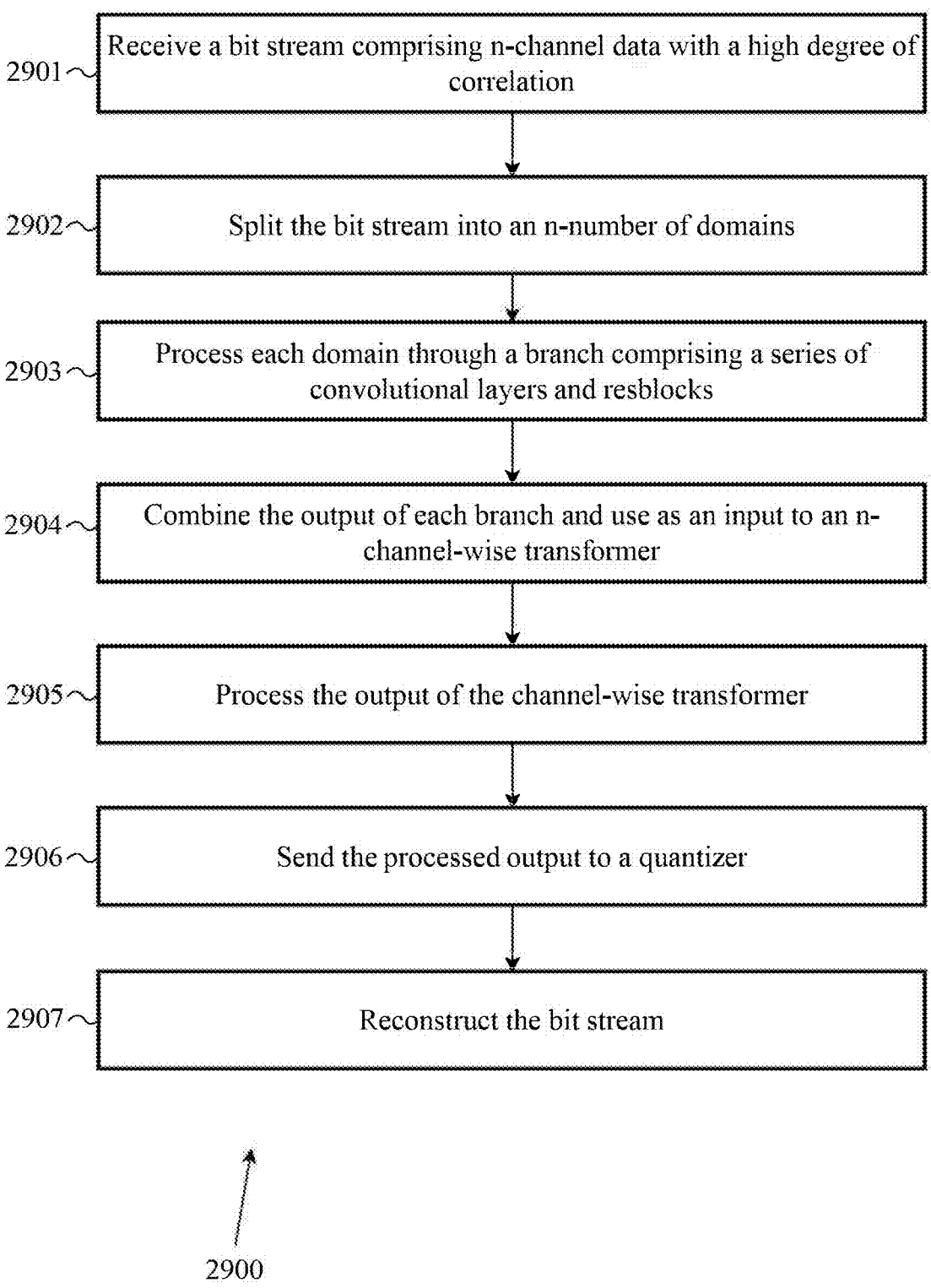

2901 — Receive a bit stream comprising n-channel data with a high degree of correlation 2902 — Split the bit stream into an n-number of domains 2903 — Process each domain through a branch comprising a series of convolutional layers and resblocks 2904 — Combine the output of each branch and use as an input to an n-channel-wise transformer 2905 — Process the output of the channel-wise transformer 2906 — Send the processed output to a quantizer 2907 — Reconstruct the bit stream

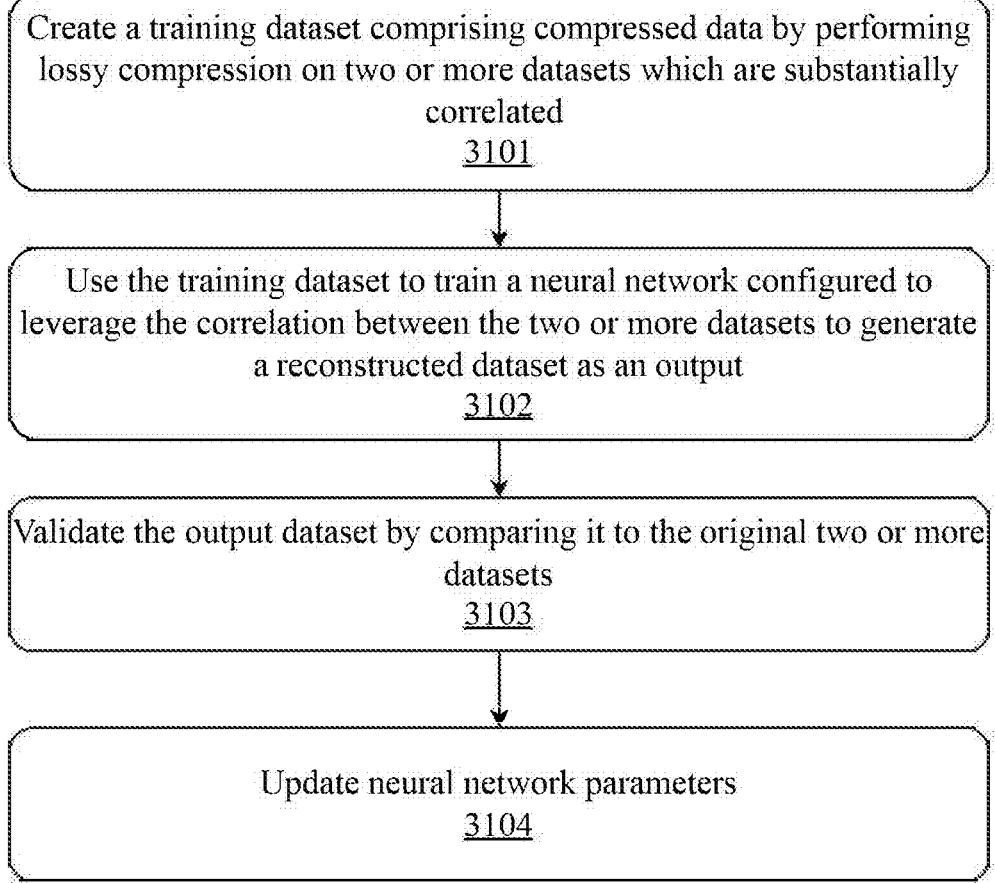

Create a training dataset comprising compressed data by performing lossy compression on two or more datasets which are substantially correlated
3101

Use the training dataset to train a neural network configured to leverage the correlation between the two or more datasets to generate a reconstructed dataset as an output
3102

Validate the output dataset by comparing it to the original two or more datasets
3103

Update neural network parameters
3104

FIG. 31

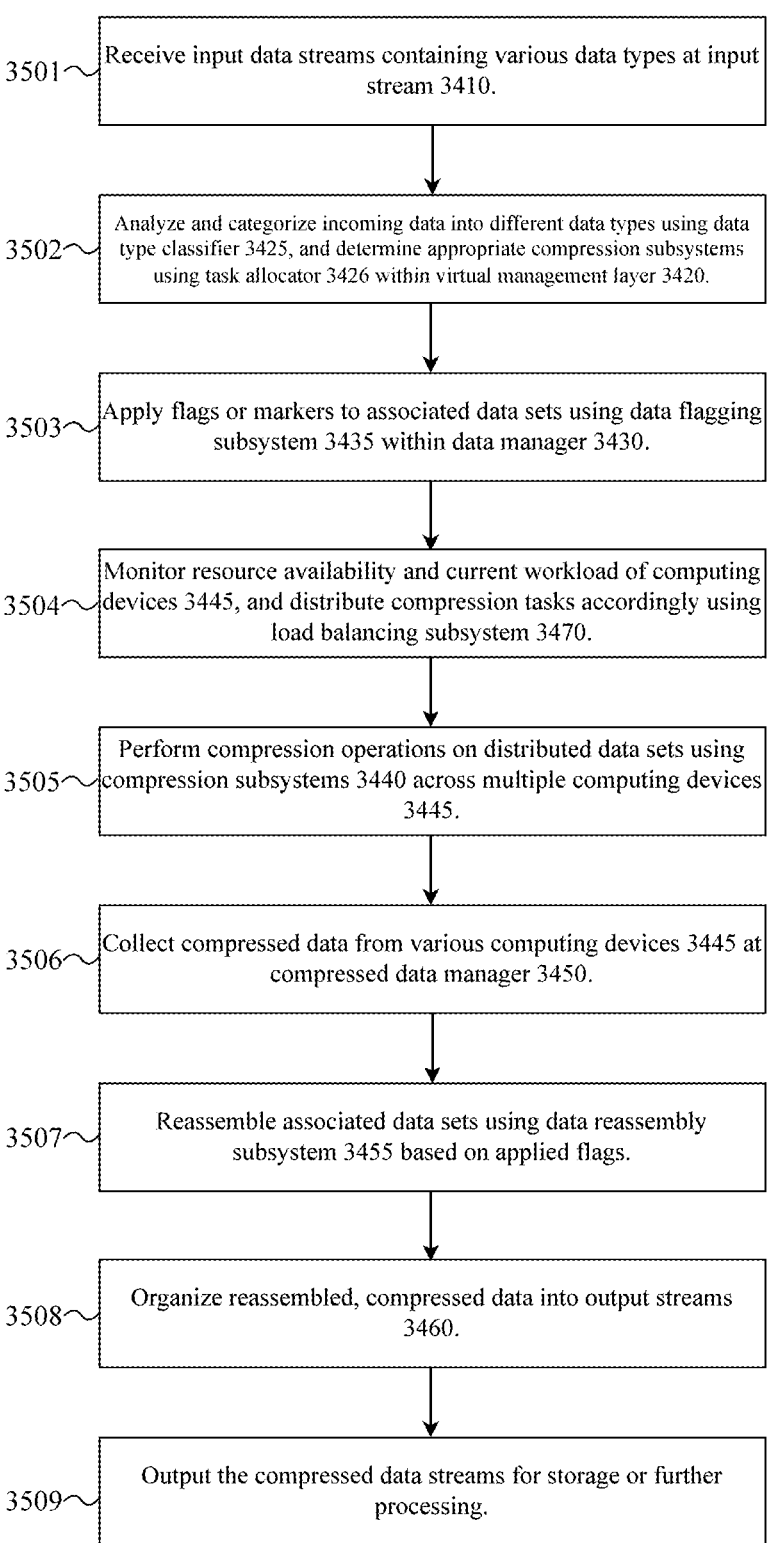

3501 — Receive input data streams containing various data types at input stream 3410.

3502 — Analyze and categorize incoming data into different data types using data type classifier 3425, and determine appropriate compression subsystems using task allocator 3426 within virtual management layer 3420.

3503 — Apply flags or markers to associated data sets using data flagging subsystem 3435 within data manager 3430.

3504 — Monitor resource availability and current workload of computing devices 3445, and distribute compression tasks accordingly using load balancing subsystem 3470.

3505 — Perform compression operations on distributed data sets using compression subsystems 3440 across multiple computing devices 3445.

3506 — Collect compressed data from various computing devices 3445 at compressed data manager 3450.

3507 — Reassemble associated data sets using data reassembly subsystem 3455 based on applied flags.

3508 — Organize reassembled, compressed data into output streams 3460.

3509 — Output the compressed data streams for storage or further processing.

FIG. 35

SYSTEM AND METHOD FOR MULTI-TYPE DATA COMPRESSION OR DECOMPRESSION WITH A VIRTUAL MANAGEMENT LAYER

CROSS-REFERENCE TO RELATED APPLICATIONS

Priority is claimed in the application data sheet to the following patents or patent applications, each of which is expressly incorporated herein by reference in its entirety:

Ser. No. 18/657,719
Ser. No. 18/423,287
Ser. No. 18/501,987
Ser. No. 18/190,044
Ser. No. 17/875,201
Ser. No. 17/514,913
Ser. No. 17/404,699
Ser. No. 16/455,655
Ser. No. 16/200,466
Ser. No. 15/975,741
62/578,824
Ser. No. 17/458,747
Ser. No. 16/923,039
63/027,166
Ser. No. 16/716,098
62/926,723
63/388,411
Ser. No. 17/727,913
Ser. No. 18/410,980
Ser. No. 18/537,728

BACKGROUND OF THE INVENTION

Field of the Art

The present invention is in the field of data compaction, and more particularly is directed to the problem of efficiently compressing or decompressing various data types using a variety of methods simultaneously.

Discussion of the State of the Art

When it comes to compressing data into a smaller form, a large variety of methods exist. For many applications, such as video compression for streaming video, lossy compression techniques such as HEVC (high-efficiency video coding) optimize the use of available bandwidth. By definition, lossy compression involves the loss of some of the data being transmitted in the process of compression; in the video compression example, this results in lower-resolution video and provides the reason for pixelated video in low-bandwidth situations. By contrast, there exist scenarios where sacrificing information is not desirable. In one example, the compression of a text document would be meaningless if portions of the text were lost during the compression process. In some cases, single streams of information may contain portions where lossless compression is desirable and portions where lossy compression is sufficient. For example, some visual satellite data may be compressed using a lossy technique while the corresponding metadata may be compressed using a lossless technique to preserve as much information as possible.

Generally, with data compression, the set of data is passed through a single compression technique which results in a compressed output of that particular data set. This results in other types of data which may be closely related to the original set of data either being inefficiently compressed or not compressed at all. One example of this is visual or auditory satellite data where the actual visual or auditory data may be compressed but the associated metadata remains either uncompressed or compressed with loss. This is because visual and auditory data are generally compressed using a lossy compression technique.

What is needed is a system that allows for a variety of data types to be efficiently compressed using a plurality of techniques that maximize the amount and quality of information that may be recovered after compression.

SUMMARY OF THE INVENTION

Accordingly, the inventor has conceived and reduced to practice a system and method for multi-type data compression or decompression with a virtual management layer in a distributed computing environment. The system and method allow a plurality of different data types to be sorted by their typing, for example, clustering all visual data together, clustering all metadata together, or clustering all text data together. This may be accomplished through a virtual management layer which controls the flow of information throughout the system and distributes processing tasks across multiple computing devices. The system may incorporate a plurality of various data compression or decompression subsystems which are tasked by the virtual management layer with compressing or decompressing a particular data type, with these tasks being allocated across available computing resources. Additionally, the virtual management layer may flag information so that it can be easily identified after compression, even when processed on different devices. The flag also allows data types which are associated with one another to be paired after the compression is complete, regardless of which devices performed the compression. For example, visual satellite data and corresponding metadata may pass into the system. The virtual management layer may separate the two data types into visual data and metadata, flag them as being related to one another, and distribute them to different computing devices for processing. The system would then pass the data through compression subsystems which may be selected by the virtual management layer to maximize the efficiency of the compression or decompression of the particular data type, taking into account the current workload and capacity of the available computing devices.

In one embodiment of the invention, the system includes compression or decompression subsystems which use statistical compression or decompression techniques. Additionally, the system may include compression or decompression subsystems which use codebook or neural network-based compression or decompression compression or decompression techniques. These subsystems may be distributed across multiple computing devices to enable parallel processing of data sets.

According to a preferred embodiment, a system for multi-type data compression or decompression with a virtual management layer in a distributed environment, comprising: a plurality of computing devices, each comprising at least a memory and a processor; a plurality of programming instructions stored in the memory and operable on the processor of each computing device, wherein the plurality of programming instructions, when operating on the processors, cause the computing devices to: organize a plurality of incoming data types into a plurality of data sets in a virtual management layer, wherein the virtual management layer allocates a compression or decompression system for each data set across the plurality of computing devices; process the plurality of data sets through each data set's corresponding compression or decompression system where the compression or decompression system outputs a plurality of compressed or decompressed data sets; and output the plurality of compressed or decompressed data sets to a desired output location, is disclosed.

According to another preferred embodiment, a method for distributed multi-type data compression or decompression with a virtual management layer, comprising: organizing a plurality of incoming data types into a plurality of data sets in a virtual management layer; allocating, by the virtual management layer, a compression or decompression system for each data set across a plurality of computing devices; processing the plurality of data sets through each data set's corresponding compression or decompression system where the compression or decompression system outputs a plurality of compressed or decompressed data sets; and outputting the plurality of compressed or decompressed data sets to a desired output location, is disclosed.

According to an aspect of an embodiment, a plurality of associated data sets may be flagged or marked as similar before entering the compression or decompression system by a data manager, and these flags are maintained across the distributed processing environment.

According to an aspect of an embodiment, the plurality of associated data sets that have been flagged or marked are regrouped together in a compressed or decompressed data manager after compression or decompression has taken place, regardless of which computing devices performed the compression or decompression.

According to another aspect of an embodiment, the virtual management layer is configured to distribute the processing of data sets across the plurality of computing devices based on available resources and processing requirements, implementing load balancing to optimize system performance.

According to yet another aspect of an embodiment, the system implements fault tolerance by replicating critical data across multiple computing devices in the distributed system, ensuring data integrity and system reliability.

BRIEF DESCRIPTION OF THE DRAWING FIGURES

FIG. 4 is a flow diagram illustrating an exemplary method for compression using a multi-type data compaction with a virtual management layer system.

FIG. 5 is a flow diagram illustrating an exemplary method for decompression using a multi-type data compaction with a virtual management layer system.

FIGS. 22A and 22B illustrate an exemplary architecture for an AI deblocking network configured to provide deblocking on dual-channel data stream comprising SAR I/Q data, according to an embodiment.

FIG. 26 is a flow diagram illustrating an exemplary method for deblocking using a trained deep learning algorithm, according to an embodiment.

FIGS. 27A and 27B illustrate an exemplary architecture for an AI deblocking network configured to provide deblocking for a general N-channel data stream, according to an embodiment.

FIG. 29 is a flow diagram illustrating an exemplary method for processing a compressed n-channel bit stream using an AI deblocking network, according to an embodiment.

FIG. 31 is a flow diagram illustrating an exemplary method for training a neural network to perform upsampling of decompressed data after lossy compression, according to an embodiment.

FIG. 35 is a method diagram illustrating the use of distributed architecture system.

DETAILED DESCRIPTION OF THE INVENTION

Figure 1:
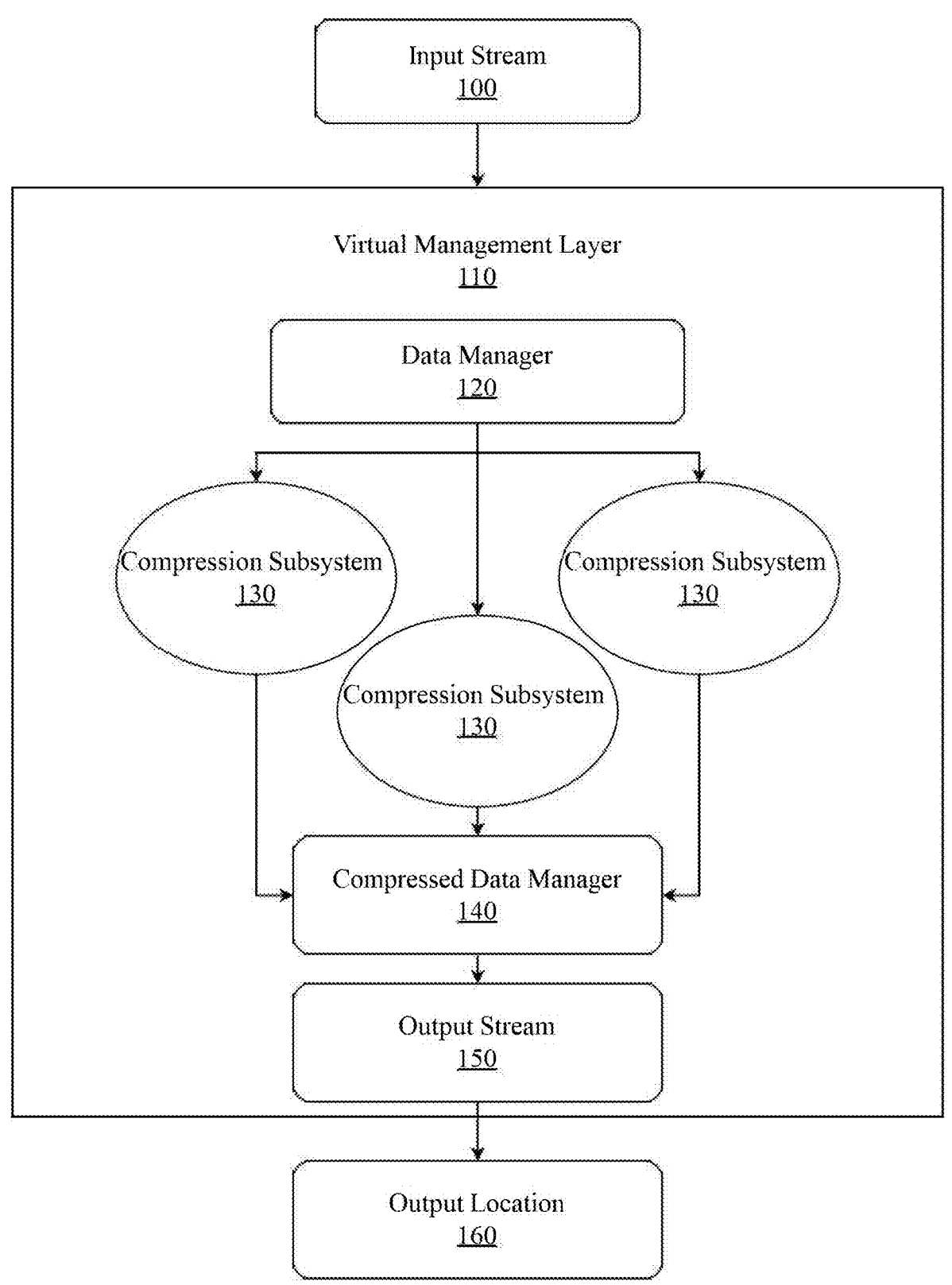
FIG. 1 is a diagram showing an embodiment of the system for multi-type data compression or decompression with a virtual management layer.

The inventor has conceived, and reduced to practice, a system and methods for multi-type data compression or decompression with a virtual management layer in a distributed computing environment. It incorporates a virtual management layer which organizes incoming data types and allocates compression or decompression tasks across multiple computing devices. The system comprises a plurality of computing devices, each with at least a memory and a processor, capable of executing the compression or decompression tasks in parallel. The virtual management layer sends data to a plurality of data compression or decompression subsystems distributed across the multiple computing devices. These subsystems may employ various compression or decompression techniques, including both lossy and lossless techniques. This plurality of techniques allows a variety of different data types to be compressed or decompressed as efficiently as possible for each particular data type.

A key feature of the system is its ability to flag or mark associated data sets as similar before they enter the compression or decompression process. After compression or decompression, which may occur on different devices, these associated data sets are regrouped together, preserving their relationships regardless of which device performed the processing.

The system includes a load balancing subsystem configured to dynamically allocate processing tasks among the plurality of computing devices based on their current workload and capacity. This ensures optimal use of available resources and enhances overall system performance. For large data sets, the virtual management layer can segment the data and distribute these segments across multiple devices for parallel processing, further improving efficiency.

After compression, the compressed outputs may be paired with their associated data that was separated by the virtual management layer before compression, or the compressed outputs may be directly passed to a desired output location. The plurality of data compression or decompression subsystems may include those which use statistical compression or decompression techniques, as well as those employing codebook or neural network-based compression or decompression techniques.

The system also implements fault tolerance measures by replicating critical data across multiple computing devices in the distributed system, ensuring data integrity and system reliability. This distributed architecture allows the system to handle larger volumes of data and process multiple data types simultaneously, significantly enhancing its scalability and performance compared to non-distributed systems.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods, and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "codebook" refers to a database containing sourceblocks each with a pattern of bits and reference code unique within that library. The terms "library" and "encoding/decoding library" are synonymous with the term codebook.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data set" refers to a grouping of data for a particular purpose. One example of a data set might be a word processing file containing text and formatting information. Another example of a data set might comprise data gathered/generated as the result of one or more radars in operation.

The term "sourcepacket" as used herein means a packet of data received for encoding or decoding. A sourcepacket may be a portion of a data set.

The term "sourceblock" as used herein means a defined number of bits or bytes used as the block size for encoding or decoding. A sourcepacket may be divisible into a number of sourceblocks. As one non-limiting example, a 1-megabyte sourcepacket of data may be encoded using 512-byte sourceblocks. The number of bits in a sourceblock may be dynamically optimized by the system during operation. In one aspect, a sourceblock may be of the same length as the block size used by a particular file system, typically 512 bytes or 4,096 bytes.

The term "codeword" refers to the reference code form in which data is stored or transmitted in an aspect of the system. A codeword consists of a reference code to a sourceblock in the library plus an indication of that sourceblock's location in a particular data set.

The term "deblocking" as used herein refers to a technique used to reduce or eliminate blocky artifacts that can occur in compressed images or videos. These artifacts are a result of lossy compression algorithms, such as JPEG for images or various video codecs like H.264, H.265 (HEVC), and others, which divide the image or video into blocks and encode them with varying levels of quality. Blocky artifacts, also known as "blocking artifacts," become visible when the compression ratio is high, or the bitrate is low. These artifacts manifest as noticeable edges or discontinuities between adjacent blocks in the image or video. The result is a visual degradation characterized by visible square or rectangular regions, which can significantly reduce the overall quality and aesthetics of the content. Deblocking techniques are applied during the decoding process to mitigate or remove these artifacts. These techniques typically involve post-processing steps that smooth out the transitions between adjacent blocks, thus improving the overall visual appearance of the image or video. Deblocking filters are commonly used in video codecs to reduce the impact of blocking artifacts on the decoded video frames. A primary goal of deblocking is to enhance the perceptual quality of the compressed content, making it more visually appealing to viewers. It's important to note that deblocking is just one of many post-processing steps applied during the decoding and playback of compressed images and videos to improve their quality.

Conceptual Architecture

FIG. 1 is a diagram showing an embodiment of the system for multi-type data compression or decompression with a virtual management layer in a distributed computing environment. In one embodiment, the system may include an input stream 100, a virtual management layer 110, a data manager 120, a plurality of compression subsystems 130 distributed across multiple computing devices, a compressed data manager 140, a plurality of output streams 150, an output location 160, and a load balancing module 170. The input stream 100 may include a single stream of information or a plurality of streams of information. Information may take the form of any data type which convey information, including but not limited to text, images, audio, video, structured data, scientific data, genomic data, or point cloud data. If unsupported data types are presented to the system, the system may give the user an error which conveys why compression or decompression wasn't possible. Additionally, the user may be prompted with the possible data type inputs based on the plurality of available compression or decompression subsystems at the time.

Generally, information may be collected from a plurality of data sources. Different data sources may produce different types of data. For example, a satellite may produce images which also have corresponding metadata. The plurality of data would pass through the virtual management layer 110 in the form of an input stream 100. The virtual management layer 110 may then parse the incoming input stream 100 and categorize each set of incoming data into a particular type. For example, all incoming image data may be grouped together, likewise, all incoming text data may be grouped separately. In one embodiment, the virtual management layer 110 groups incoming data based on the plurality of available compression or decompression subsystems. Each compression or decompression subsystem may be comprised of different compression or decompression algorithms and systems. Each compression or decompression subsystem may be tailored to a particular data type present in the input stream 100.

The virtual management layer 110 includes a distributed processing capability, allowing it to allocate compression or decompression tasks across multiple computing devices. This is facilitated by the load balancing module 170, which monitors the current workload and capacity of each computing device in the distributed system. The load balancing module 170 works in conjunction with the virtual management layer 110 to optimize task distribution, ensuring efficient use of available resources.

The compression subsystems 130 are distributed across multiple computing devices, allowing for parallel processing of data sets. This distributed architecture enables the system to handle larger volumes of data and process multiple data types simultaneously, improving overall system performance and scalability.

The compressed data manager 140 handles the distributed nature of the compressed outputs. It can now receive and manage compressed data from compression subsystems 130 running on different computing devices. The compressed data manager 140 ensures that associated data sets are correctly regrouped, regardless of which devices performed the compression.

The system implements fault tolerance measures, with critical data being replicated across multiple computing devices. This ensures data integrity and system reliability in the distributed environment.

As mentioned, the compression or decompression technique used for a particular data type may be selected to maximize efficiency for a particular data type. For example, of the virtual management system 110 determined that the incoming data type is a text file, the compression or decompression subsystems 130 may include but are not limited to, Huffman Coding, Arithmetic Coding, Run-Length Encoding, or Burrows-Wheeler Transforms. For images which include but are not limited to Joint Photographic Experts Groups (JPEGs), Portable Network Graphics (PNGs), and Graphic Interchange Formats (GIFs), the compression or decompression subsystems 130 may include but are not limited to Discrete Cosine Transforms, Deflate Algorithms, Wavelet Transforms, and Lempel-Ziv-Welch Transforms. Generally, image compression may involve compression and decompression techniques that operate in a spatial domain, a frequency domain, or both, where spatial domain techniques operate directly on pixels where frequency domain techniques break images into color components and then operate on the components.

If the incoming data type is audio in nature, such as but not limited to MPEG-1 Audio Layer 3 (MP3) files, the compression and decompression subsystems 130 may include techniques such as but not limited to Modified Discrete Cosine Transforms, Advanced Audio Coding, and Linear Prediction. For incoming data types that are video in nature, such as but not limited to H.264/Advanced Video Coding (AVC) files, H.265/High Efficiency Video Coding (HEVC) files, Audio Video Interleave (AVI) files, or MPEG-4 files, the compression or decompression subsystems 130 may include techniques such as but not limited to Discrete Cosine Transforms and Motion Compensation. Similar to images, video compression and decompression may also operate in a spatial or frequency domain. For data types including geometric data, compression and decompression subsystems 130 may include techniques such as but not limited to Binary Alignment Maps (BAMs), Compressed Alignment Maps (CRAMs), Variant Call Format Compression (VCF), or Reference-Based Compression. Additionally, for data types that include point cloud data, compression, and decompression subsystems 130 may include techniques such as but not limited to Octree Encoding, Geometry Compression, Attribute Compression, Entropy Coding, and Quantization and Prediction.

After the plurality of data is compressed by the plurality of compression subsystems 130, the compressed outputs are passed through a compressed data manager 140. The compressed data manager 140 may receive compressed data from any number of compression subsystems 130. Additionally, the compressed data manager 140 may merge data that has been marked as associated back together into an associated data pair. For example, if an image data type with corresponding metadata was passed through the data manager 120 and marked as associated data types, the compressed data manager 140 may link those associated data types back together after compression. The compressed data manager 140 outputs a plurality of output streams 150 where each data stream represents a particular data type that has been compressed by a corresponding compression subsystem 130. In one embodiment all of the data is preserved in a single output stream where the single output stream represents all of the compressed data from the plurality of compression subsystems 130. In another embodiment, the output streams 150 may be a plurality of streams each coming from a corresponding compression subsystem 130. When the streams are kept separate, a user may access any compressed data set from any particular compression subsystem 130. For example, a user may specifically want to access compressed image data from a compressed subsystem 130 that maximizes the compression efficiency for images specifically.

The plurality of output streams 150 may be output to an output location 160. The output locations 160 may be any plurality of locations, including but not limited to a plurality of databases, a plurality of cloud storage systems, a plurality of personal devices, or any plurality of systems which has a sufficient memory capacity to store the compressed output streams 150.

Figure 2:
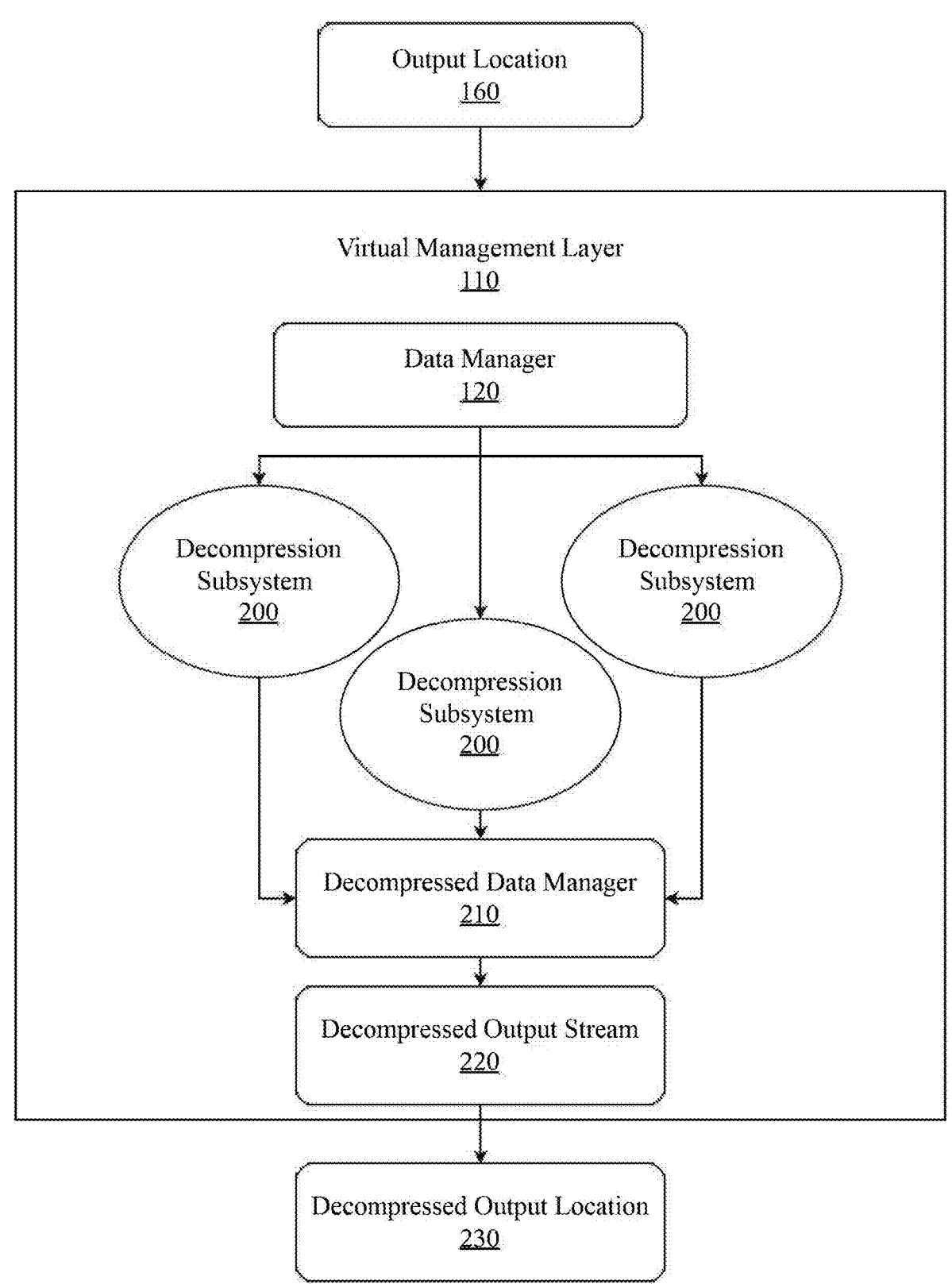
FIG. 2 is a diagram showing an embodiment of the system for multi-type data compaction with a virtual management layer where the system has been configured for data decompression.

FIG. 2 is a diagram showing an embodiment of the system for multi-type data compression or decompression with a virtual management layer where the system has been configured for data decompression. In one embodiment, the system may be configured to decompress an input which has been compressed. The virtual management layer 110 may receive a compressed data set from an output location 160 which may include but is not limited to a plurality of databases, a plurality of cloud storage systems, a plurality of personal devices, or any plurality of systems which have sufficient memory capacity to store a compressed data set. The virtual management layer 120 operates the same way for both compression and decompression systems. For a decompression system, the virtual management layer 120 organizes and groups the incoming compressed data set by each data set's data type. The data grouped data types are then passed through a corresponding decompression subsystem 200 which decompresses the data type back into its original form. The plurality of decompression subsystems may include a plurality of various data decompression techniques. In some embodiments, the plurality of decompression techniques may include but are not limited to, lossy techniques, lossless techniques, statistical techniques, or techniques that utilize neural networks to maximize efficiency. Each decompression subsystem 200 may correspond to a particular data type where the decompression subsystem 200 utilizes a decompression technique that is best suited for the particular data type. For example, image and video data types generally utilize lossy data decompression which maximizes efficiency without sacrificing the quality of a compressed and decompressed data set. On the contrary, a text file may be decompressed using a lossless decompression technique so that the entire data file is preserved as close to the original as possible.

In one embodiment, the decompression subsystem 200 may be configured to identify and prevent decompression bombs. Decompression bombs are malicious files which cause harm by overwhelming a systems resource during decompression. Generally, decompression bombs appear to contain small amounts of information, but when decompressed, actually contain more information than a system can handle at a particular time. In one embodiment, the decompression subsystems 200 may monitor the decompression ratio of a particular data set. If the decompression ratio exceeds a predetermined threshold that suggests the file is a decompression bomb, the decompression subsystem 200 may be forced to abort the decompression process. In other embodiments, the decompression subsystem 200 may either be self-contained, or store the decompressed output to a location which is self-contained from the rest of the decompression system. By self-containing the output or the decompression subsystem 200, decompression bombs would be unable to draw resources from the rest of the system.

After a data set is decompressed, it may be passed through a decompressed data manager 210. The decompressed data manager may cluster associated data typed that were separated during the compression process back together based on whether they have been marked by the data manager 120 as associated. If preferred, a user may simply output each data set individually without grouping associated data sets. The decompressed data manager 210 may then output the compressed data sets as a decompressed output stream 220 which may be a single stream from a particular decompression subsystem, or a plurality of streams where associated streams are linked together by marks that were applied by the data manager 120. Decompressed data sets may be output to any location a user selects, but it will likely be a user device that has sufficient memory to store the decompressed data sets. Additional decompressed output locations 230 may include but are not limited to, a plurality of databased, a plurality of cloud storage systems, local memory in a user's electronic device, or removable memory currently plugged into a user's device.

Figure 3:
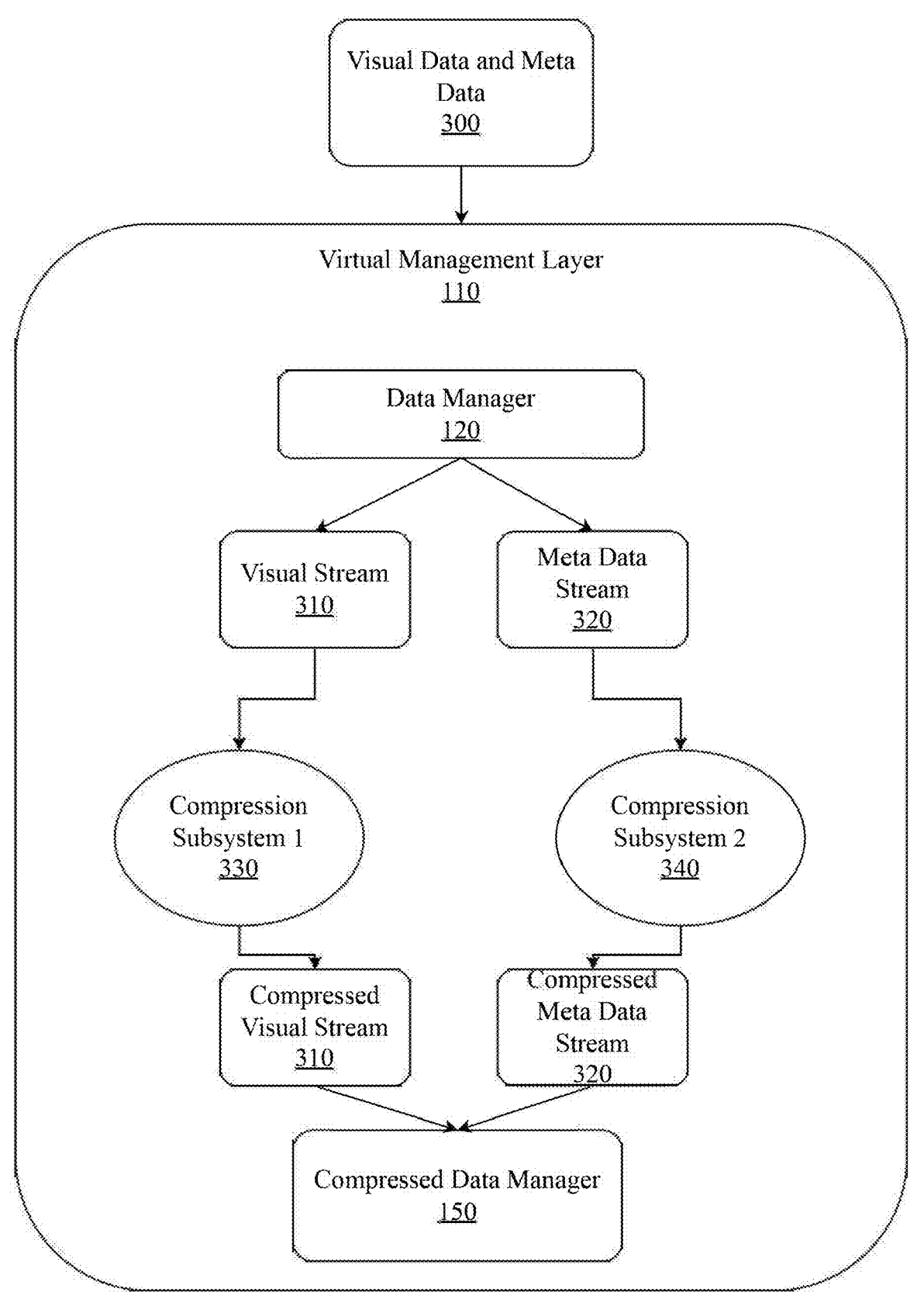
FIG. 3 is a diagram showing an embodiment of the system for multi-type data compaction with a virtual management layer, specifically, a configuration of input and output streams.

FIG. 3 is a diagram showing an embodiment of the system for multi-type data compression or decompression with a virtual management layer, specifically, a configuration of input and output streams. In one embodiment, the virtual management layer 110 may receive visual data and associated metadata 300 from a data source. The virtual management layer may pass both data types through a data manager 110 which may flag the two data types as associated. The data types would then be split into two sets, a visual stream 310 and a metadata stream 320 which would be passed through a corresponding compression subsystem which utilizes a technique best suited for compressing the incoming data type. For example, the visual stream 310 may be passed through a compression subsystem 1 330 which may include but is not limited to a lossy compression technique to efficiently compress video information without sacrificing the overall integrity of the original file. Likewise, the metadata stream 320 may be passed through a compression subsystem 2 340 which may include but is not limited to a lossless compression technique to ensure that the original form of the metadata stream is preserved as best as possible, and no data is lost during compression.

Following compression, the compression subsystems 330 and 340 may output independent streams corresponding to the input streams. In this case, compression subsystem 1 330 may output a compressed visual stream which is a compressed version of visual stream 310. Additionally, compression subsystem 2 340 may output a compressed metadata stream which is a compressed version of the metadata stream 320. Each stream may be passed through a compressed data manager 150 which allows a user to either group associated streams back together or to view independent streams individually.

FIG. 4 is a flow diagram illustrating an exemplary method for compression using a multi-type data compression or decompression with a virtual management layer system. In a first step 400, collect a plurality of data from a plurality of sources. In a step 410, pass the plurality of data through a virtual management layer where the virtual management layer includes a data manager, a plurality of compression subsystems, and a compressed data manager. In a step 420, organize the incoming data into streams and flag each stream with markers using the data manager. In a step 430, process the streams into a plurality of compressed streams with the plurality of compression subsystems. In a step 440, combine the plurality of compressed streams or output the plurality of compressed streams separately depending on flagged markers and preferences. In a step 450, send the plurality of compressed streams to an output location.

FIG. 5 is a flow diagram illustrating an exemplary method for decompression using a multi-type data compaction with virtual management layer system. In a first step 500, collect a plurality of compressed data from an output location. In a step 510, pass the plurality of compressed data through a virtual management layer where the virtual management layer includes a data manager, a plurality of decompression subsystems, and a decompressed data manager. In a step 520, organize the incoming data into streams and flag each stream with markers using the data manager. In a step 530, process the streams into a plurality of decompressed streams with the plurality of decompression subsystems. In a step 540, combine the plurality of decompressed streams or output the plurality of decompressed streams separately depending on flagged markers and preferences. In a step 550, output the plurality of decompressed streams.

Figure 6:
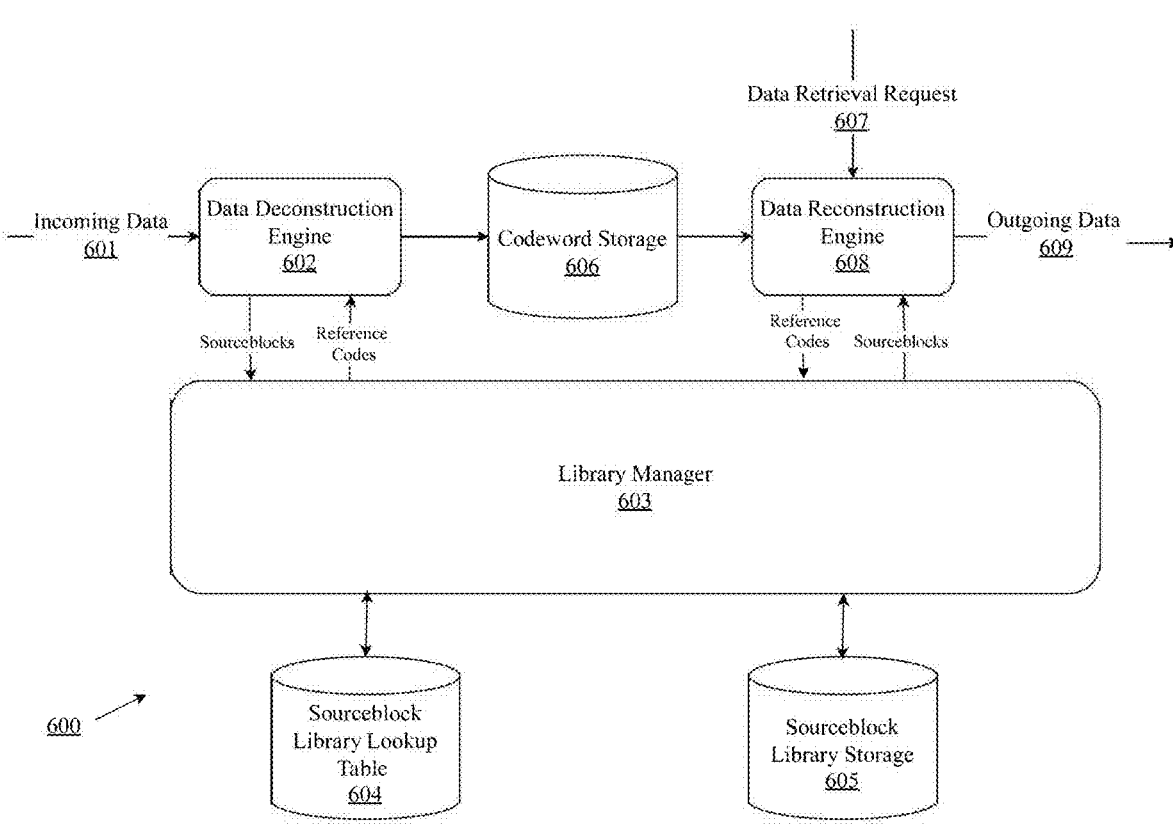
FIG. 6 is a diagram showing an embodiment of a codebook-based compression and decompression subsystem in which all components of the system are operated locally.

FIG. 6 is a diagram showing an embodiment 600 of a codebook-based compression and decompression system in which all components of the system are operated locally. As incoming data 601 is received by data deconstruction engine 602. Data deconstruction engine 602 breaks the incoming data into sourceblocks, which are then sent to library manager 603. Using the information contained in sourceblock library lookup table 604 and sourceblock library storage 605, library manager 603 returns reference codes to data deconstruction engine 602 for processing into codewords, which are stored in codeword storage 606. When a data retrieval request 607 is received, data reconstruction engine 608 obtains the codewords associated with the data from codeword storage 606 and sends them to library manager 603. Library manager 603 returns the appropriate source-blocks to data reconstruction engine 608, which assembles them into the proper order and sends out the data in its original form 609.

Figure 7:
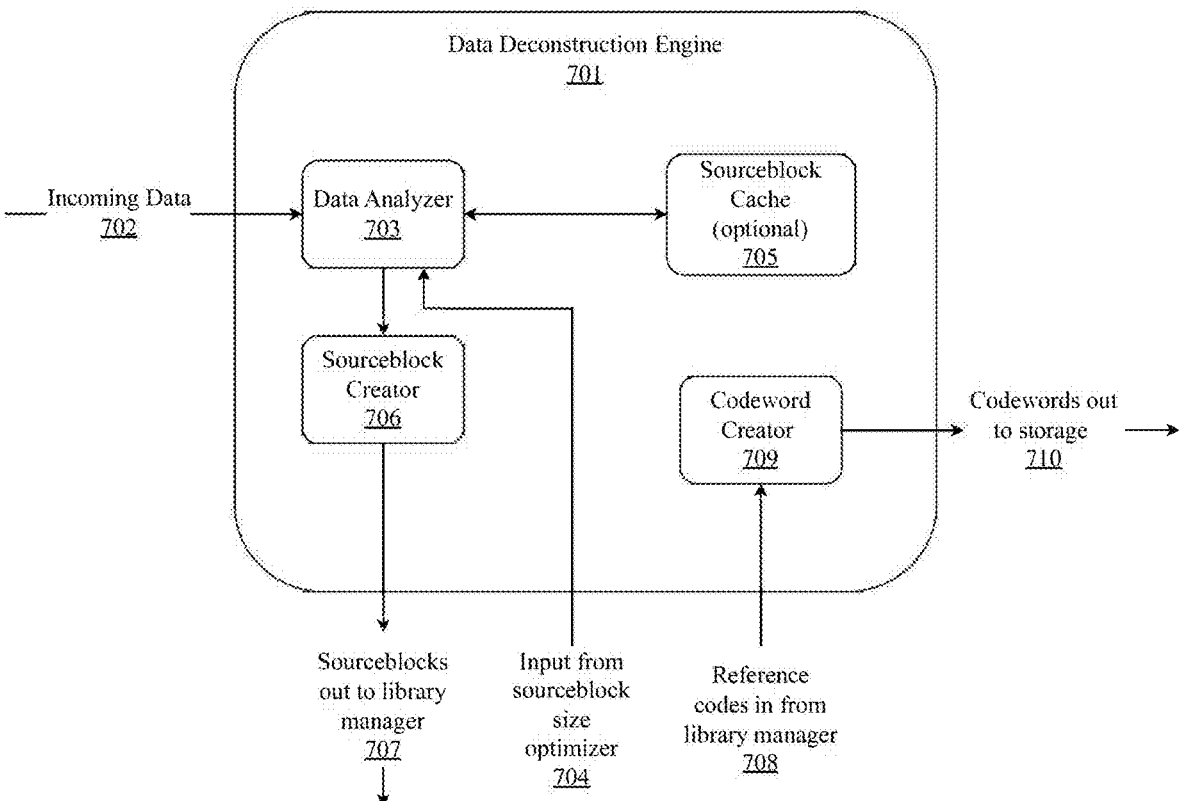
FIG. 7 is a diagram showing an embodiment of one aspect of the codebook-based compression and decompression subsystem, the data deconstruction engine.

FIG. 7 is a diagram showing an embodiment of one aspect 700 of the codebook-based compression and decompression system, specifically data deconstruction engine 701. Incoming data 702 is received by data analyzer 703, which optimally analyzes the data based on machine learning algorithms and input 704 from a sourceblock size optimizer, which is disclosed below. Data analyzer may optionally have access to a sourceblock cache 705 of recently processed sourceblocks, which can increase the speed of the system by avoiding processing in library manager 603. Based on information from data analyzer 703, the data is broken into sourceblocks by sourceblock creator 706, which sends sourceblocks 707 to library manager 703 for additional processing. Data deconstruction engine 701 receives reference codes 708 from library manager 603, corresponding to the sourceblocks in the library that match the sourceblocks sent by sourceblock creator 706, and codeword creator 709 processes the reference codes into codewords comprising a reference code to a sourceblock and a location of that sourceblock within the data set. The original data may be discarded, and the codewords representing the data are sent out to storage 710.

Figure 8:
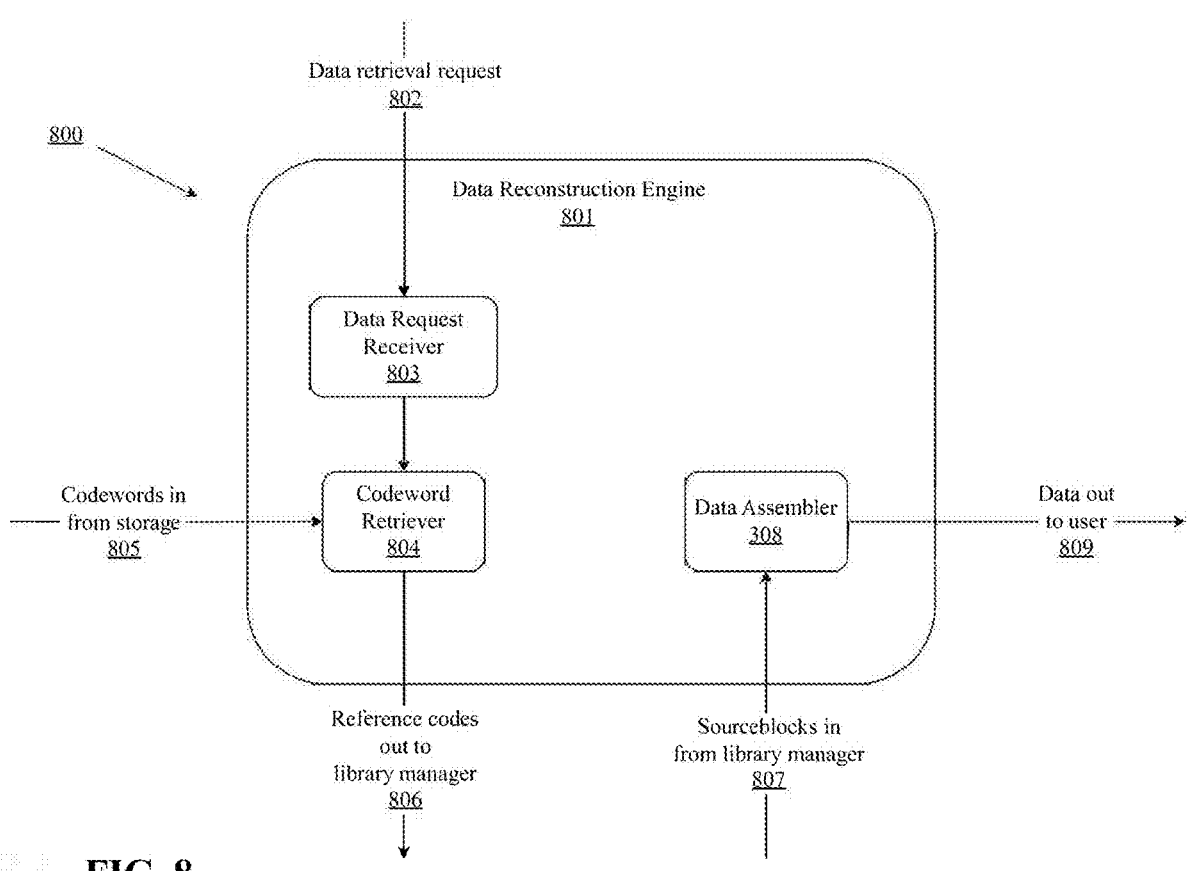
FIG. 8 is a diagram showing an embodiment of one aspect of the codebook-based compression and decompression subsystem, the data reconstruction engine.

FIG. 8 is a diagram showing an embodiment of another aspect of system 800, specifically data reconstruction engine 801. When a data retrieval request 802 is received by data request receiver 803 (in the form of a plurality of codewords corresponding to a desired final data set), it passes the information to data retriever 804, which obtains the requested data 805 from storage. Data retriever 804 sends, for each codeword received, a reference code from the codeword 806 to library manager 603 for retrieval of the specific sourceblock associated with the reference code. Data assembler 808 receives the sourceblock 807 from library manager 603 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 809 in its original form.

Figure 9:
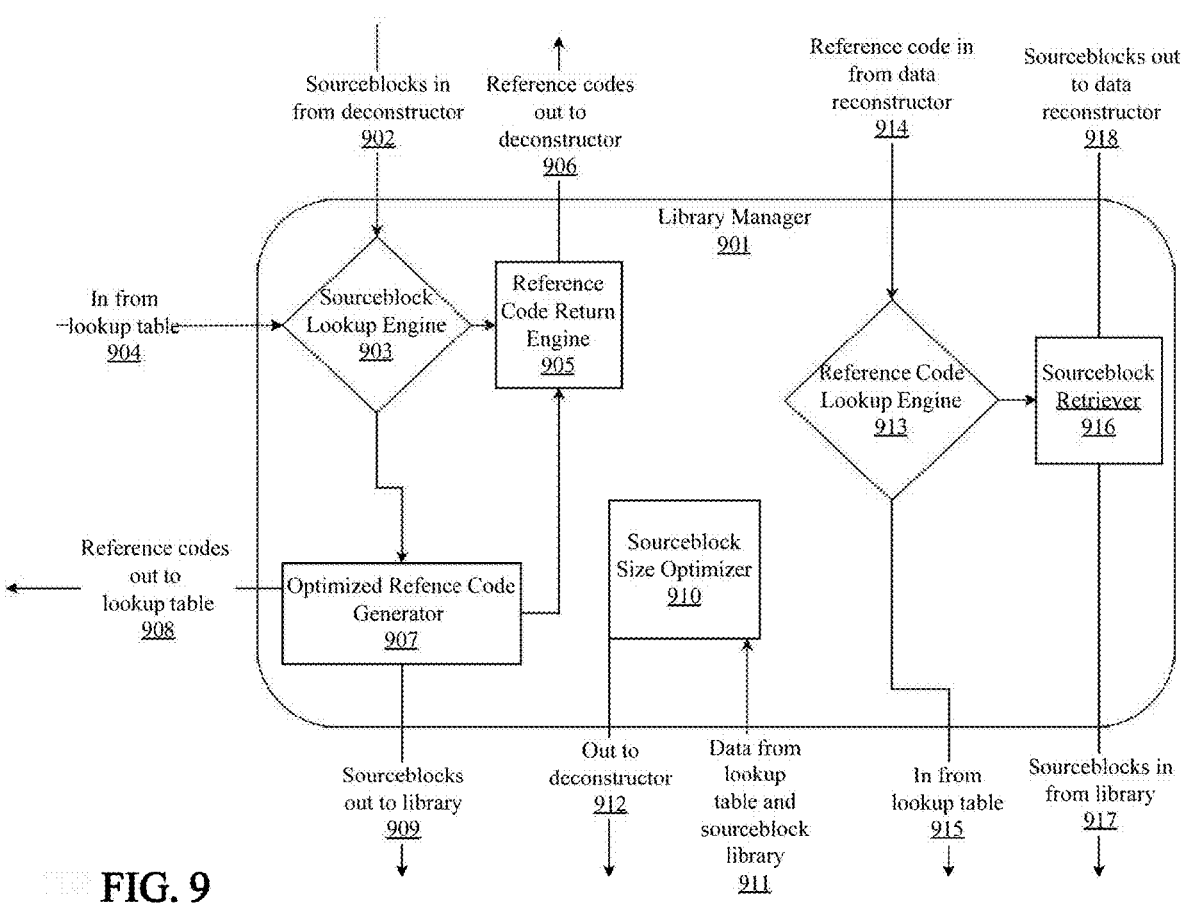
FIG. 9 is a diagram showing an embodiment of one aspect of the system, the library management module.

FIG. 9 is a diagram showing an embodiment of another aspect of the system 900, specifically library manager 901. One function of library manager 901 is to generate reference codes from sourceblocks received from data deconstruction engine 801. As sourceblocks are received 902 from data deconstruction engine 801, sourceblock lookup engine 903 checks sourceblock library lookup table 904 to determine whether those sourceblocks already exist in sourceblock library storage 605. If a particular sourceblock exists in sourceblock library storage 605, reference code return engine 905 sends the appropriate reference code 906 to data deconstruction engine 801. If the sourceblock does not exist in sourceblock library storage 605, optimized reference code generator 907 generates a new, optimized reference code based on machine learning algorithms. Optimized reference code generator 907 then saves the reference code 908 to sourceblock library lookup table 604; saves the associated sourceblock 909 to sourceblock library storage 605; and passes the reference code to reference code return engine 905 for sending 906 to data deconstruction engine 801. Another function of library manager 901 is to optimize the size of sourceblocks in the system. Based on information 911 contained in sourceblock library lookup table 604, sourceblock size optimizer 910 dynamically adjusts the size of sourceblocks in the system based on machine learning algorithms and outputs that information 912 to data analyzer 703. Another function of library manager 901 is to return sourceblocks associated with reference codes received from data reconstruction engine 801. As reference codes are received 914 from data reconstruction engine 801, reference code lookup engine 413 checks sourceblock library lookup table 915 to identify the associated sourceblocks; passes that information to sourceblock retriever 916, which obtains the sourceblocks 917 from sourceblock library storage 605; and passes them 918 to data reconstruction engine 801.

Figure 10:
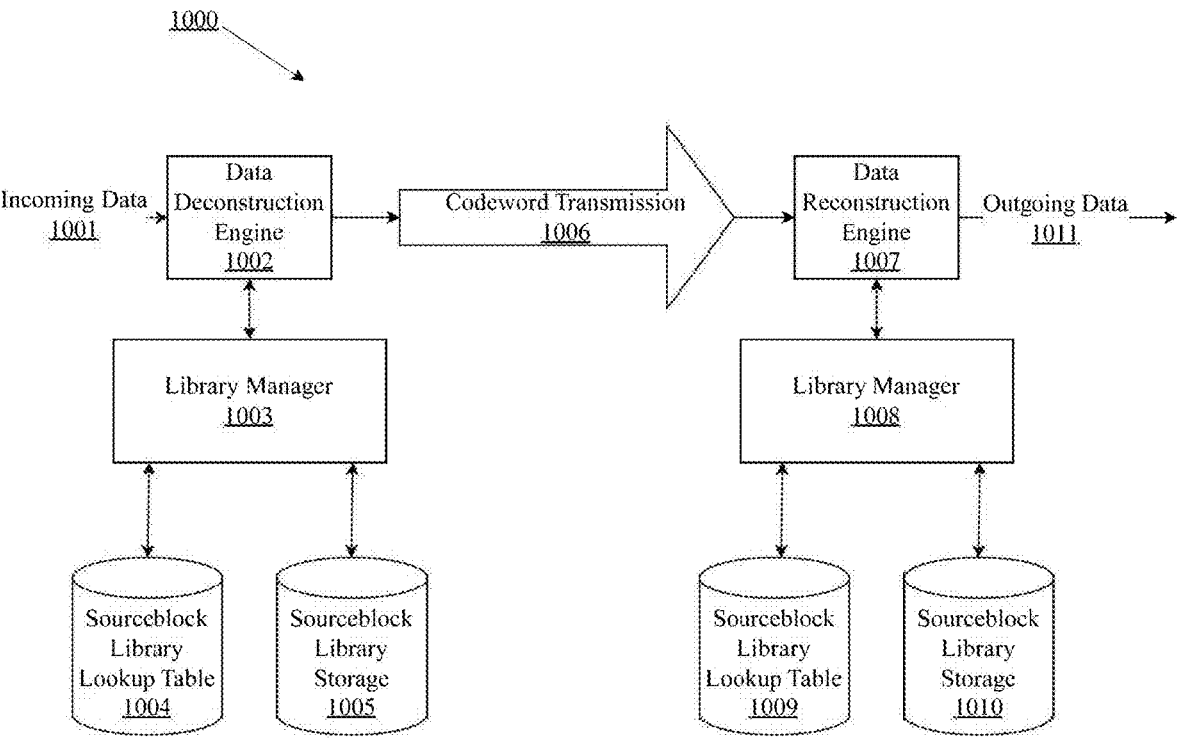
FIG. 10 is a diagram showing another embodiment of the codebook-based compression and decompression subsystem in which data is transferred between remote locations.

FIG. 10 is a diagram showing another embodiment of system 1000, in which data is transferred between remote locations. As incoming data 1001 is received by data deconstruction engine 1002 at Location 1, data deconstruction engine 801 breaks the incoming data into sourceblocks, which are then sent to library manager 1003 at Location 1. Using the information contained in sourceblock library lookup table 1004 at Location 1 and sourceblock library storage 1005 at Location 1, library manager 1003 returns reference codes to data deconstruction engine 801 for processing into codewords, which are transmitted 1006 to data reconstruction engine 1007 at Location 2. In the case where the reference codes contained in a particular codeword have been newly generated by library manager 1003 at Location 1, the codeword is transmitted along with a copy of the associated sourceblock. As data reconstruction engine 1007 at Location 2 receives the codewords, it passes them to library manager module 1008 at Location 2, which looks up the sourceblock in sourceblock library lookup table 1009 at Location 2 and retrieves the associated from sourceblock library storage 1010. Where a sourceblock has been transmitted along with a codeword, the sourceblock is stored in sourceblock library storage 1010 and sourceblock library lookup table 1004 is updated. Library manager 1003 returns the appropriate sourceblocks to data reconstruction engine 1007, which assembles them into the proper order and sends the data in its original form 1011.

Figure 11:
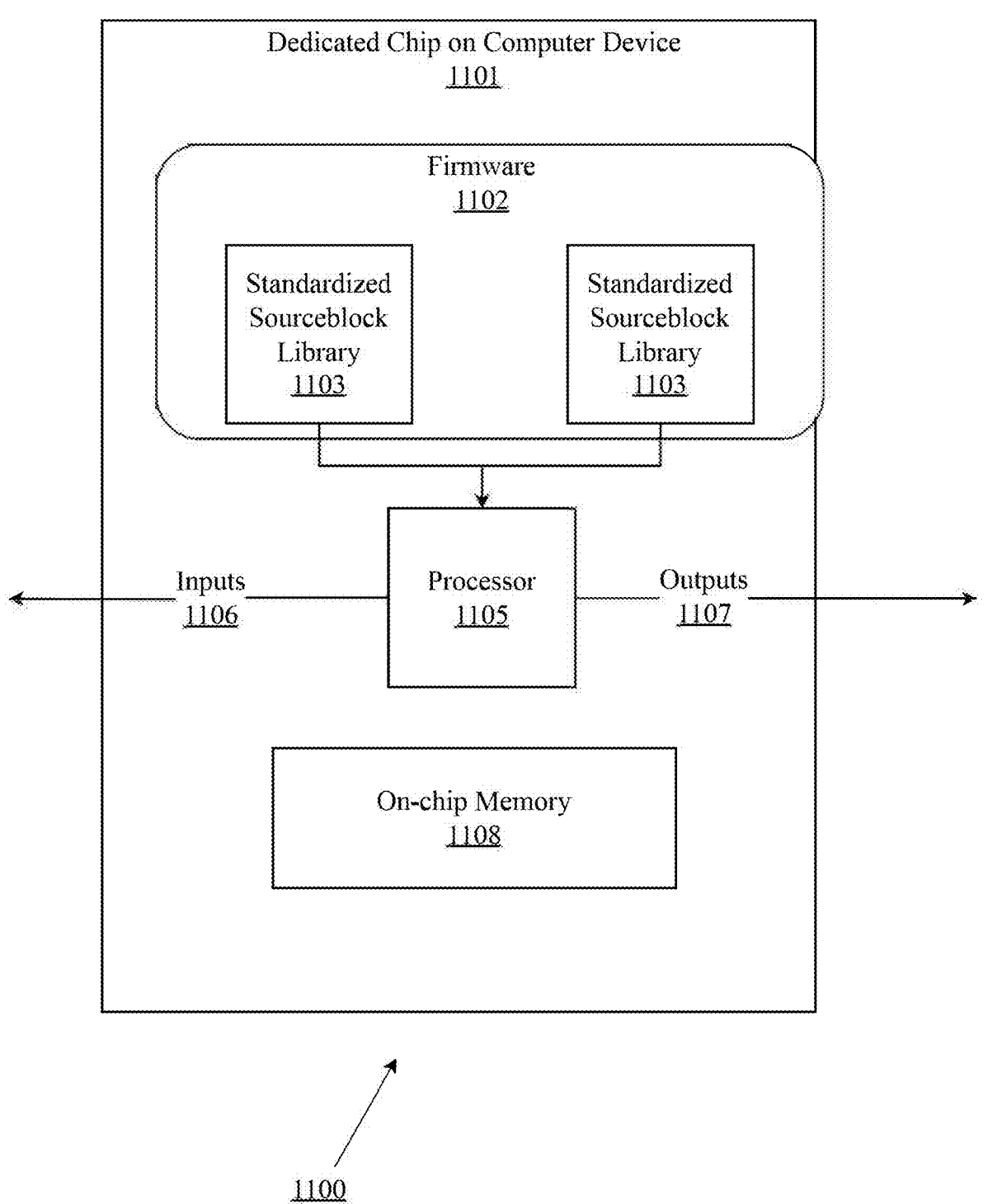
FIG. 11 is a diagram showing an embodiment in which a standardized version of the sourceblock library and associated algorithms would be encoded as firmware on a dedicated processing chip included as part of the hardware of a plurality of devices.

FIG. 11 is a diagram showing an embodiment 1100 in which a standardized version of a sourceblock library 1103 and associated algorithms 1104 would be encoded as firmware 1102 on a dedicated processing chip 1101 included as part of the hardware of a plurality of devices 1100. Contained on dedicated chip 1101 would be a firmware area 1102, on which would be stored a copy of a standardized sourceblock library 1103 and deconstruction/reconstruction algorithms 1104 for processing the data. Processor 605 would have both inputs 606 and outputs 1107 to other hardware on the device 1100. Processor 1105 would store incoming data for processing on on-chip memory 1108, process the data using standardized sourceblock library 1103 and deconstruction/reconstruction algorithms 1104, and send the processed data to other hardware on device 1100. Using this embodiment, the encoding and decoding of data would be handled by dedicated chip 1101, keeping the burden of data processing off device's 1100 primary processors. Any device equipped with this embodiment would be able to store and transmit data in a highly optimized, bandwidth-efficient format with any other device equipped with this embodiment.

Figure 12:
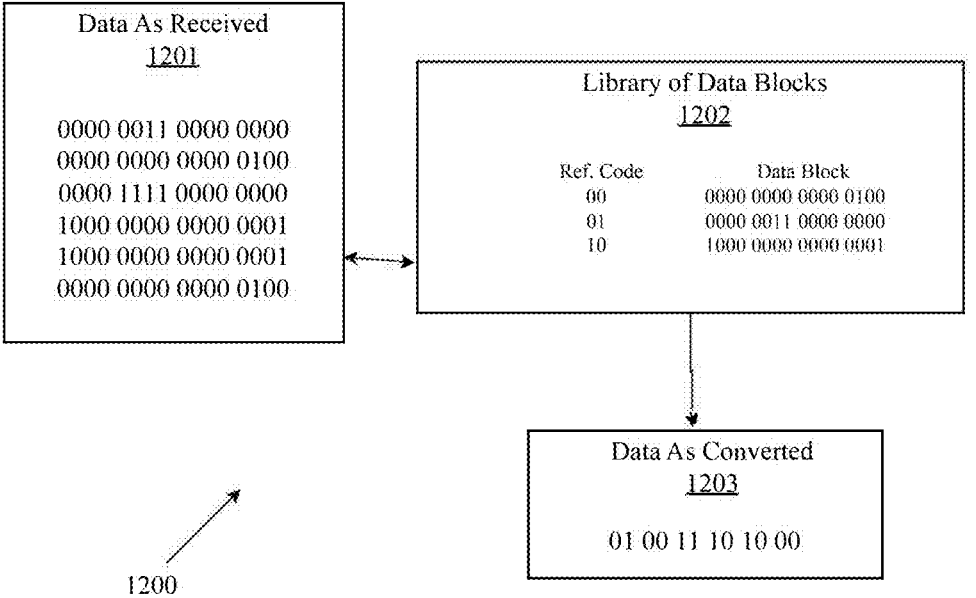
FIG. 12 is a diagram showing an example of how data might be converted into reference codes using an aspect of an embodiment.

FIG. 12 is a diagram showing an example of how data might be converted into reference codes using an aspect of an embodiment 1200. As data is received 1201, it is read by the processor in sourceblocks of a size dynamically determined by the previously disclosed sourceblock size optimizer 910. In this example, each sourceblock is 16 bits in length, and the library 1202 initially contains three sourceblocks with reference codes 00, 01, and 10. The entry for reference code 11 is initially empty. As each 16-bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 1203 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form.

Figure 13:
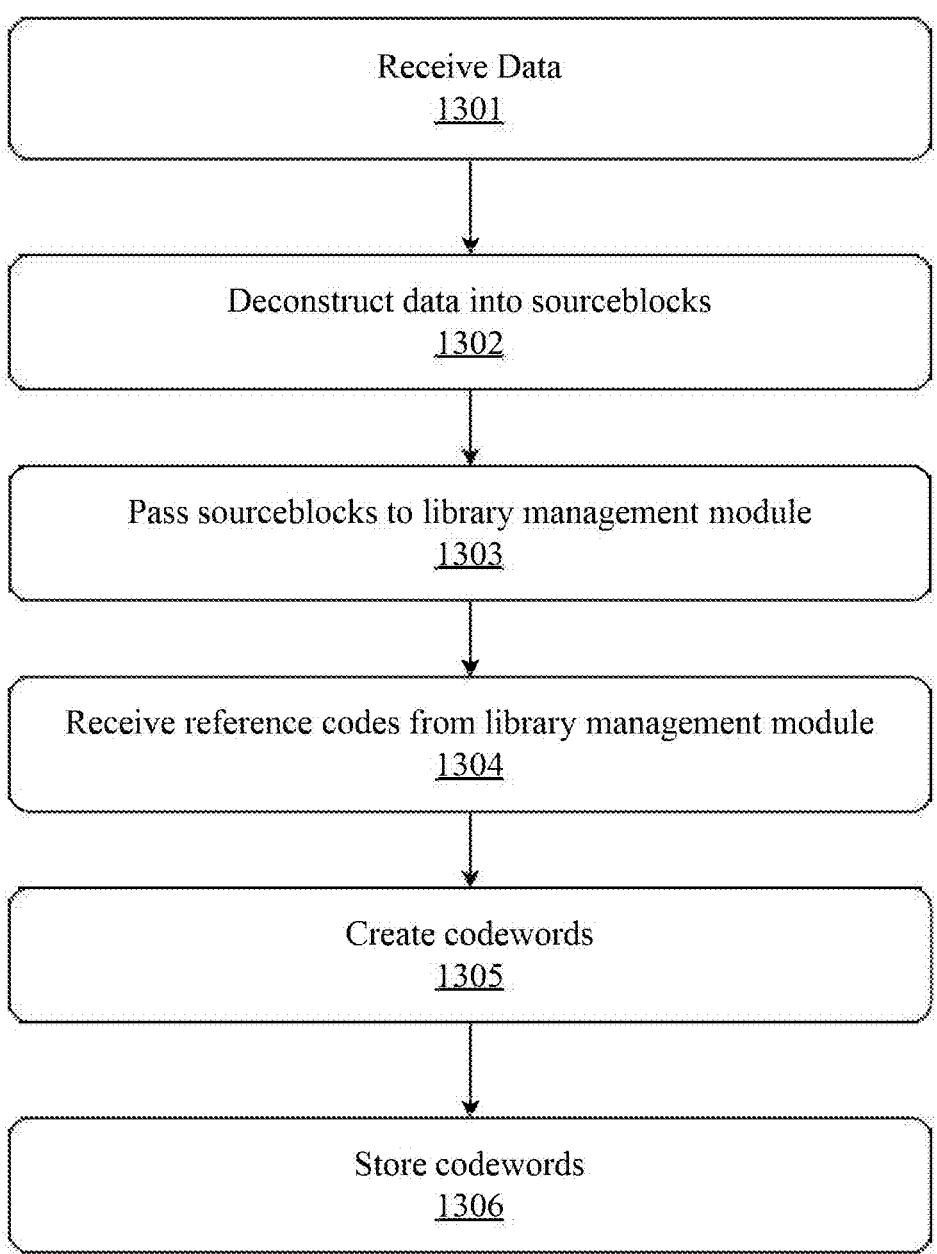
FIG. 13 is a method diagram showing the steps involved in using an embodiment to store data.

FIG. 13 is a method diagram showing the steps involved in using an embodiment 1300 to store data. As data is received 1301, it would be deconstructed into sourceblocks 1302, and passed 1303 to the library management module for processing. Reference codes would be received back 1304 from the library management module and could be combined with location information to create codewords 1305, which would then be stored 1306 as representations of the original data.

Figure 14:
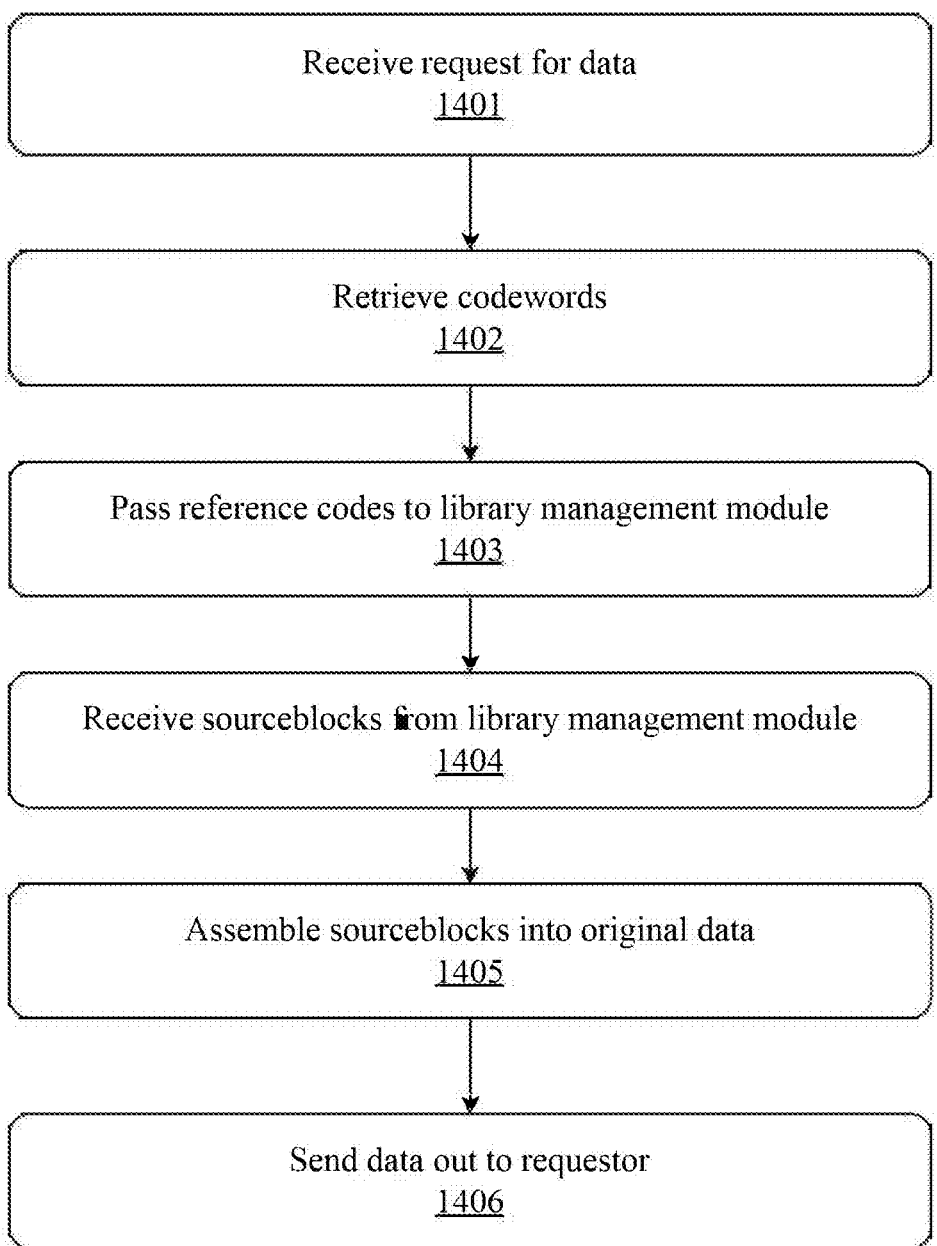
FIG. 14 is a method diagram showing the steps involved in using an embodiment to retrieve data.

FIG. 14 is a method diagram showing the steps involved in using an embodiment 1400 to retrieve data. When a request for data is received 1401, the associated codewords would be retrieved 1402 from the library. The codewords would be passed 1403 to the library management module, and the associated sourceblocks would be received back 1404. Upon receipt, the sourceblocks would be assembled 1405 into the original data using the location data contained in the codewords, and the reconstructed data would be sent out 1406 to the requestor.

Figure 15:
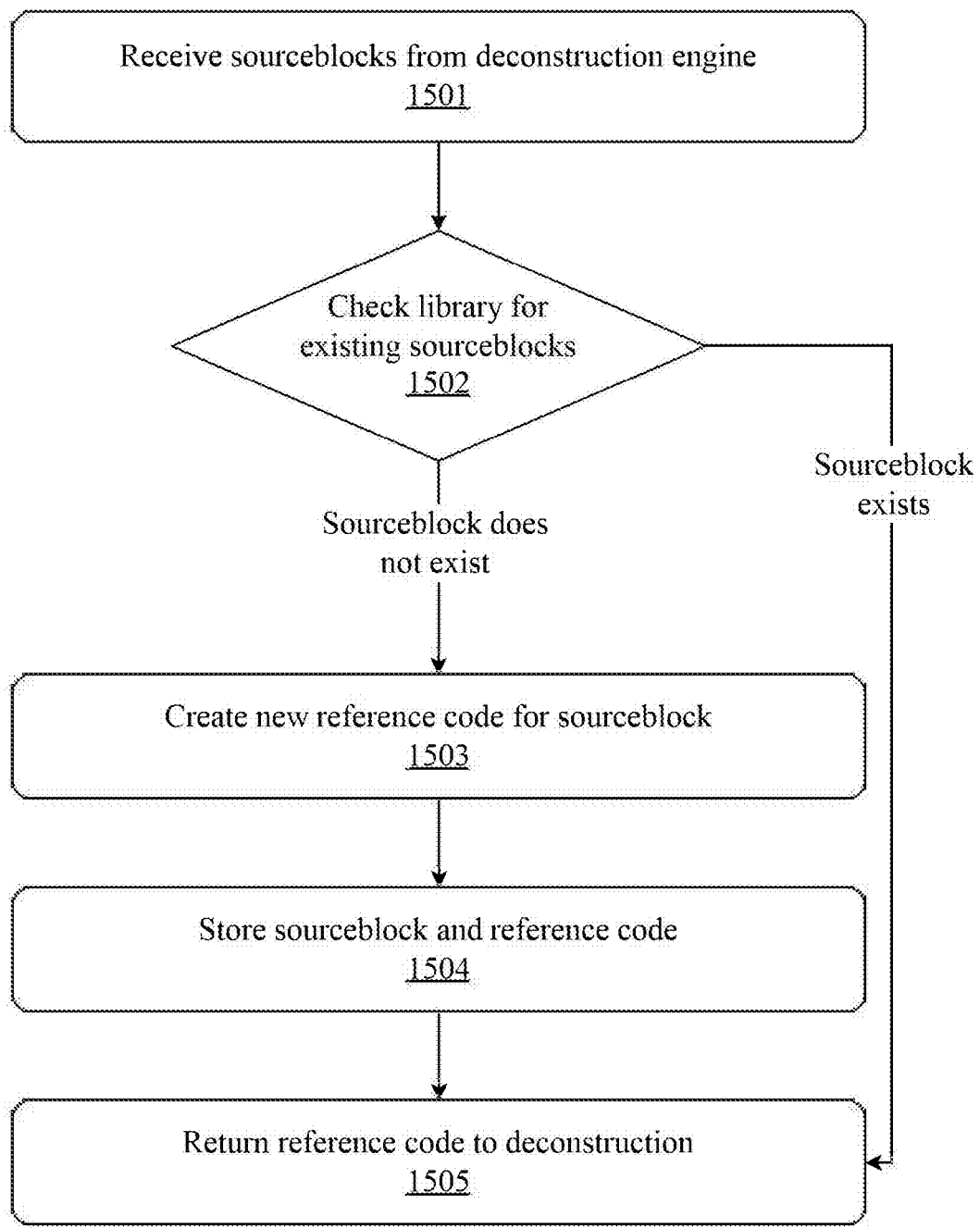
FIG. 15 is a method diagram showing the steps involved in using an embodiment to encode data.

FIG. 15 is a method diagram showing the steps involved in using an embodiment 1500 to encode data. As sourceblocks are received 1501 from the deconstruction engine, they would be compared 1502 with the sourceblocks already contained in the library. If that sourceblock already exists in the library, the associated reference code would be returned 1505 to the deconstruction engine. If the sourceblock does not already exist in the library, a new reference code would be created 1503 for the sourceblock. The new reference code and its associated sourceblock would be stored 1504 in the library, and the reference code would be returned to the deconstruction engine.

Figure 16:
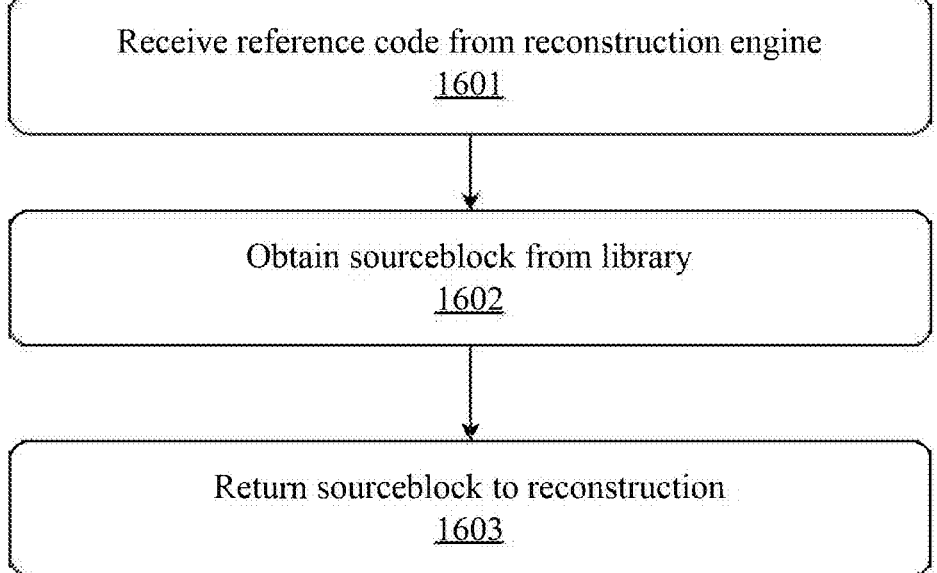
FIG. 16 is a method diagram showing the steps involved in using an embodiment to decode data.

FIG. 16 is a method diagram showing the steps involved in using an embodiment 1600 to decode data. As reference codes are received 1601 from the reconstruction engine, the associated sourceblocks are retrieved 1602 from the library, and returned 1603 to the reconstruction engine.

Figure 17:
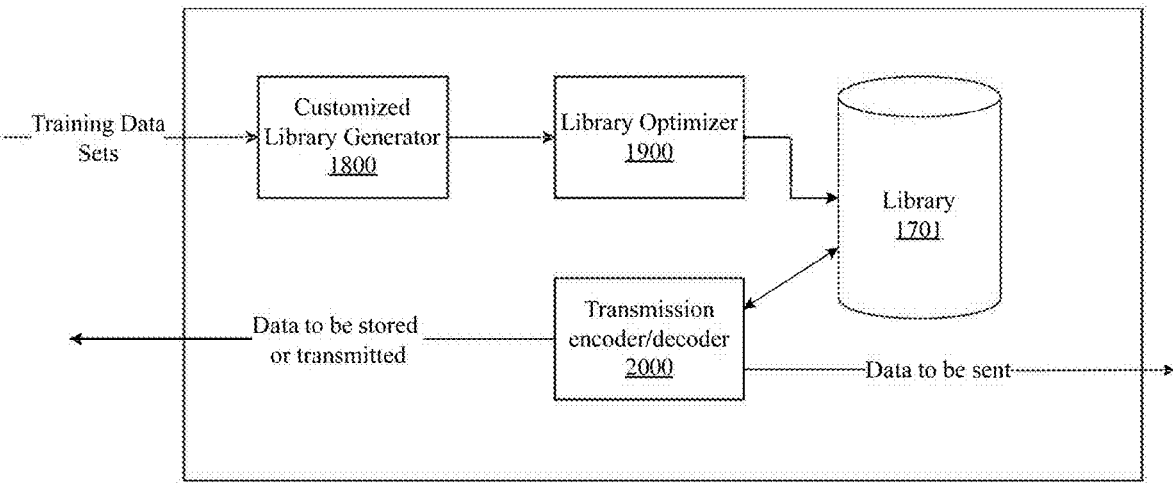
FIG. 17 is a diagram showing an exemplary system architecture, according to a preferred embodiment of the invention.

FIG. 17 is a diagram showing an exemplary system architecture 1700, according to a preferred embodiment of the invention. Incoming training data sets may be received at a customized library generator 1800 that processes training data to produce a customized word library 1701 comprising key-value pairs of data words (each comprising a string of bits) and their corresponding calculated binary Huffman codewords. The resultant word library 1701 may then be processed by a library optimizer 1900 to reduce size and improve efficiency, for example by pruning low-occurrence data entries or calculating approximate codewords that may be used to match more than one data word. A transmission encoder/decoder 2000 may be used to receive incoming data intended for storage or transmission, process the data using a word library 1701 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1700 provides near-instantaneous source coding that is dictionary-based and learned in advance from sample training data, so that encoding and decoding may happen concurrently with data transmission. This results in computational latency that is near zero, but the data size reduction is comparable to classical compression. For example, if N bits are to be transmitted from sender to receiver, the compression ratio of classical compression is C, the ratio between the deflation factor of system 1700 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1700 will be (assuming that encoding and decoding happen at least as quickly as network latency:

$$T_{new} = \frac{N_p}{CS}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C$=1.1·10$^{12}$, $R_D$=4.2·10$^{12}$, S=10$^{11}$, giving $$\frac{CS}{R_C} + \frac{S}{R_D} = 0.053 \ldots ,$$

such that system 1700 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{invention} = \frac{tp}{CS}$$

since encoding and decoding occur concurrently with data transmission. On the other hand, the latency associated with classical compression is $$\text{delay}_{priorart} = \frac{N}{R_C} + \frac{N}{CS} + \frac{N}{CR_D}$$

where N is the packet/file size. Even with the generous values chosen above as well as N=512K, t=10, and p=1.05, this results in $\text{delay}_{invention} \approx 3.3 \cdot 10^{-10}$ while $\text{delay}_{priorart} \approx 1.3 \cdot 10^{-7}$, a more than 400-fold reduction in latency.

A key factor in the efficiency of Huffman coding used by system 1700 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1700 addresses this by restriction of data types and density estimation; training data is provided that is representative of the type of data anticipated in "real-world" use of system 1700, which is then used to model the distribution of binary strings in the data in order to build a Huffman code word library 1700.

Figure 18:
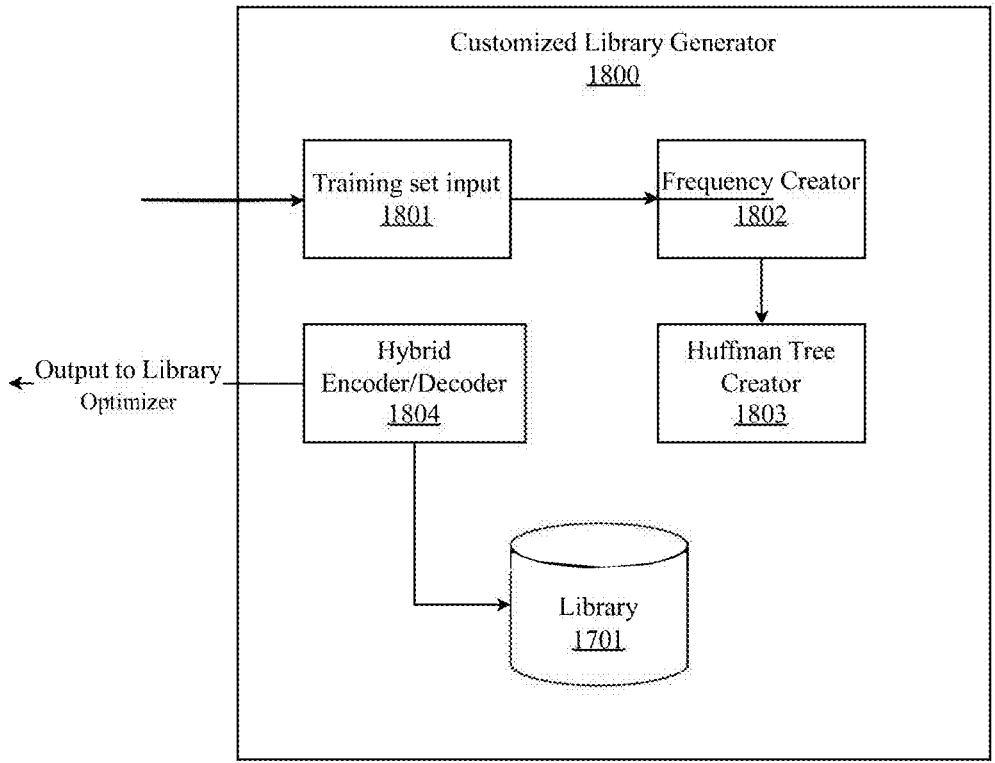
FIG. 18 is a diagram showing a more detailed architecture for a customized library generator.

FIG. 18 is a diagram showing a more detailed architecture for a customized library generator 1800. When an incoming training data set 1801 is received, it may be analyzed using a frequency creator 1802 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yields better results when used with real-world data (rather than, for example, being only based on a single training data set that may not be very similar to a received non-training data set). A second Huffman tree creator 1803 may be utilized to identify words that do not match any existing entries in a word library 1701 and pass them to a hybrid encoder/decoder 1804, that then calculates a binary Huffman codeword for the mismatched word and adds the codeword and original data to the word library 1701 as a new key-value pair. In this manner, customized library generator 1800 may be used both to establish an initial word library 1701 from a first training set, as well as expand the word library 1701 using additional training data to improve operation.

Figure 19:
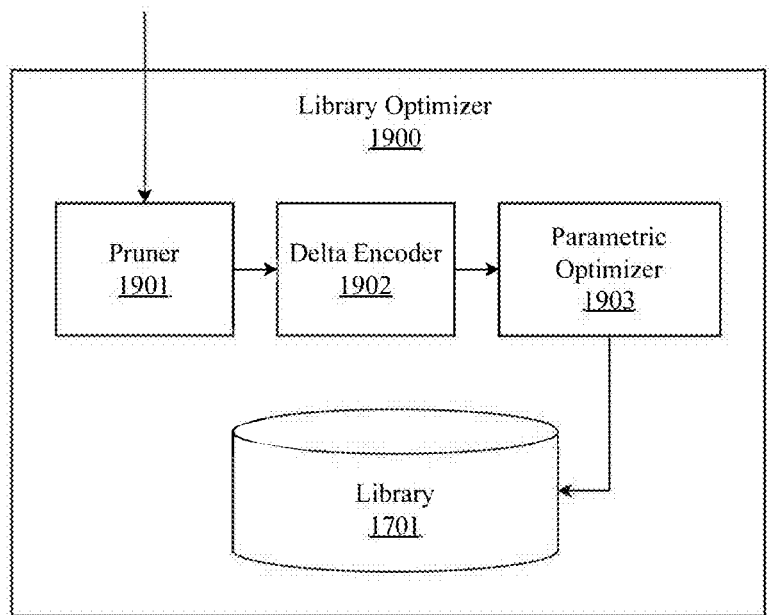
FIG. 19 is a diagram showing a more detailed architecture for a library optimizer.

FIG. 19 is a diagram showing a more detailed architecture for a library optimizer 1900. A pruner 1901 may be used to load a word library 1701 and reduce its size for efficient operation, for example by sorting the word library 1701 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1701 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1902 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1903 may load configuration parameters for operation to optimize the use of the word library 1701 during operation. Best-practice parameter/hyperparameter optimization strategies such as stochastic gradient descent, quasi-random grid search, and evolutionary search may be used to make optimal choices for all inter-dependent settings playing a role in the functionality of system 1700. In cases where lossless compression is not required, the delta value may be discarded at the expense of introducing some limited errors into any decoded (reconstructed) data.

Figure 20:
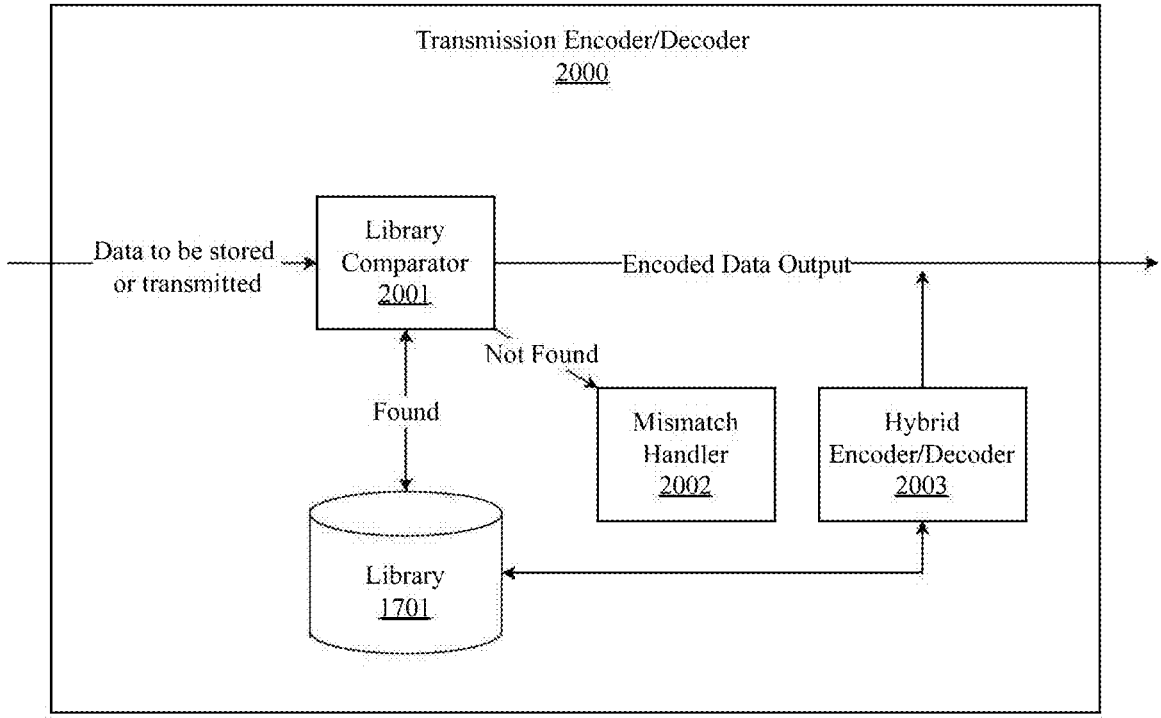
FIG. 20 is a diagram showing a more detailed architecture for a transmission and storage engine.

FIG. 20 is a diagram showing a more detailed architecture for a transmission encoder/decoder 2000. According to various arrangements, transmission encoder/decoder 2000 may be used to deconstruct data for storage or transmission, or to reconstruct data that has been received, using a word library 1701. A library comparator 2001 may be used to receive data comprising words or codewords and compare against a word library 1701 by dividing the incoming stream into substrings of length t and using a fast hash to check word library 1701 for each substring. If a substring is found in word library 1701, the corresponding key/value (that is, the corresponding source word or codeword, according to whether the substring used in comparison was itself a word or codeword) is returned and appended to an output stream. If a given substring is not found in word library 1701, a mismatch handler 2002 and hybrid encoder/decoder 2003 may be used to handle the mismatch similarly to operation during the construction or expansion of word library 1701. A mismatch handler 2002 may be utilized to identify words that do not match any existing entries in a word library 1701 and pass them to a hybrid encoder/decoder 2003, that then calculates a binary Huffman codeword for the mismatched word and adds the codeword and original data to the word library 1701 as a new key-value pair. The newly produced codeword may then be appended to the output stream. In arrangements where a mismatch indicator is included in a received data stream, this may be used to preemptively identify a substring that is not in word library 1701 (for example, if it was identified as a mismatch on the transmission end) and handled accordingly without the need for a library lookup.

Figure 21:
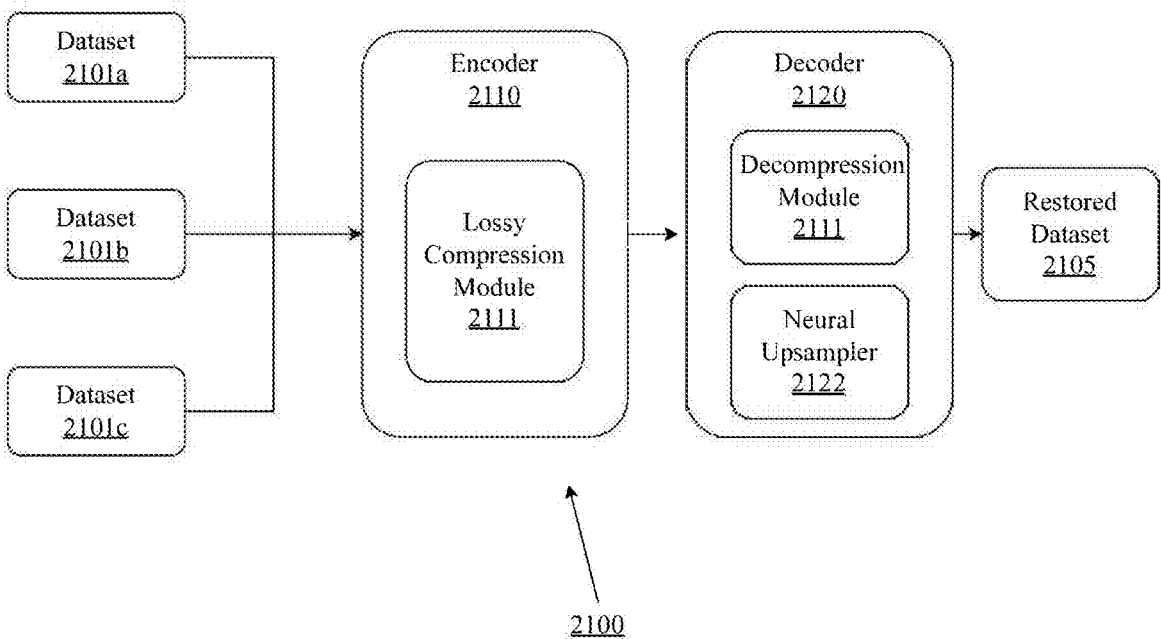
FIG. 21 is a block diagram illustrating an exemplary system architecture for a neural network-based compression or decompression subsystem, according to an embodiment.

FIG. 21 is a block diagram illustrating an exemplary system architecture 2100 for upsampling of decompressed data after lossy compression using a neural network, according to an embodiment. According to the embodiment, the system 2100 comprises an encoder module 2110 configured to receive two or more datasets 2101a-n which are substantially correlated and perform lossy compression on the received dataset, and a decoder module 2120 configured to receive a compressed bit stream and use a trained neural network to output a reconstructed dataset which can restore most of the "lost" data due to the lossy compression. Datasets 2101a-n may comprise streaming data or data received in a batch format. Datasets 2101a-n may comprise one or more datasets, data streams, data files, or various other types of data structures which may be compressed. Furthermore, dataset 2101a-n may comprise n-channel data comprising a plurality of data channels sent via a single data stream.

Encoder 2110 may utilize a lossy compression module 2111 to perform lossy compression on a received dataset 2101a-n. The type of lossy compression implemented by lossy compression module 2111 may be dependent upon the data type being processed. For example, for SAR imagery data, High Efficiency Video Coding (HEVC) may be used to compress the dataset. In another example, if the data being processed is time-series data, then delta encoding may be used to compress the dataset. The encoder 2110 may then send the compressed data as a compressed data stream to a decoder 2120 which can receive the compressed data stream and decompress the data using a decompression module 2121.

The decompression module 2121 may be configured to perform data decompression a compressed data stream using an appropriate data decompression algorithm. The decompressed data may then be used as input to a neural upsampler 2122 which utilizes a trained neural network to restore the decompressed data to nearly its original state 2105 by taking advantage of the information embedded in the correlation between the two or more datasets 2101a-n.

Figure 22A:
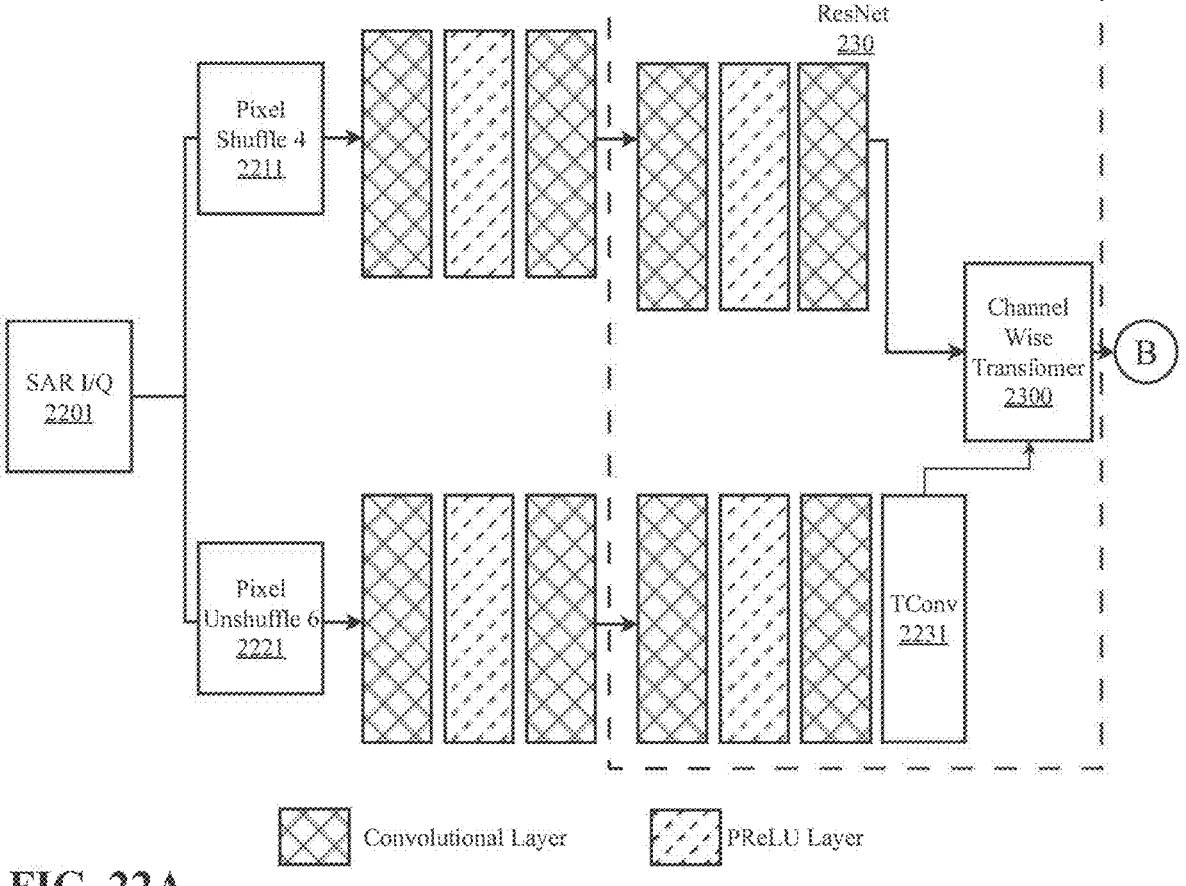

FIGS. 22A and 22B illustrate an exemplary architecture for an AI deblocking network configured to provide deblocking for dual-channel data stream comprising SAR I/Q data, according to an embodiment. In the context of this disclosure, dual-channel data refers to fact that SAR image signal can be represented as two (dual) components (i.e., I and Q) which are correlated to each other in some manner. In the case of I and Q, their correlation is that they can be transformed into phase and amplitude information and vice versa. AI deblocking network utilizes a deep learned neural network architecture for joint frequency and pixel domain learning. According to the embodiment, a network may be developed for joint learning across one or more domains. As shown, the top branch 2210 is associated with the pixel domain learning and the bottom branch 2220 is associated with the frequency domain learning. According to the embodiment, the AI deblocking network receives as input complex-valued SAR image I and Q channels 2201 which, having been encoded via encoder 2110, has subsequently been decompressed via decoder 2120 before being passed to AI deblocking network for image enhancement via artifact removal. Inspired by the residual learning network and the MSAB attention mechanism, AI deblocking network employs resblocks that take two inputs. In some implementations, to reduce complexity the spatial resolution may be downsampled to one-half and one-fourth. During the final reconstruction the data may be upsampled to its original resolution. In one implementation, in addition to downsampling, the network employs deformable convolution to extract initial features, which are then passed to the resblocks. In an embodiment, the network comprises one or more resblocks and one or more convolutional filters. In an embodiment, the network comprises 8 resblocks and 64 convolutional filters.

Deformable convolution is a type of convolutional operation that introduces spatial deformations to the standard convolutional grid, allowing the convolutional kernel to adaptively sample input features based on the learned offsets. It's a technique designed to enhance the modeling of spatial relationships and adapt to object deformations in computer vision tasks. In traditional convolutional operations, the kernel's positions are fixed and aligned on a regular grid across the input feature map. This fixed grid can limit the ability of the convolutional layer to capture complex transformations, non-rigid deformations, and variations in object appearance. Deformable convolution aims to address this limitation by introducing the concept of spatial deformations. Deformable convolution has been particularly effective in tasks like object detection and semantic segmentation, where capturing object deformations and accurately localizing object boundaries are important. By allowing the convolutional kernels to adaptively sample input features from different positions based on learned offsets, deformable convolution can improve the model's ability to handle complex and diverse visual patterns.

According to an embodiment, the network may be trained as a two-stage process, each utilizing specific loss functions. During the first stage, a mean squared error (MSE) function is used in the I/Q domain as a primary loss function for the AI deblocking network. The loss function of the SAR I/Q channel LSAR is defined as:

$$L_{SAR} = \mathbb{E}[\|I - I_{amp}\|_2]$$

Moving to the second stage, the network reconstructs the amplitude component and computes the amplitude loss using MSE as follows:

$$L_{amp} = \mathbb{E}[\|\|I_{amp} - I_{dec,amp}\|_2]$$

To calculate the overall loss, the network combines the SAR loss and the amplitude loss, incorporating a weighting factor, a, for the amplitude loss. The total loss is computed as:

$$L_{total} = L_{SAR} + \alpha \times L_{amp}$$

The weighting factor value may be selected based on the dataset used during network training. In an embodiment, the network may be trained using two different SAR datasets: the National Geospatial-Intelligence Agency (NGA) SAR dataset and the Sandia National Laboratories Mini SAR Complex Imagery dataset, both of which feature complex-valued SAR images. In an embodiment, the weighting factor is set to 0.0001 for the NGA dataset and 0.00005 for the Sandia dataset. By integrating both the SAR and amplitude losses in the total loss function, the system effectively guides the training process to simultaneously address the removal of the artifacts and maintain the fidelity of the amplitude information. The weighting factor, a, enables AI deblocking network to balance the importance of the SAR loss and the amplitude loss, ensuring comprehensive optimization of the network during the training stages. In some implementations, diverse data augmentation techniques may be used to enhance the variety of training data. For example, techniques such as horizontal and vertical flops and rotations may be implemented on the training dataset. In an embodiment, model optimization is performed using MSE loss and Adam optimizer with a learning rate initially set to $1 \times 10^{-4}$ and decreased by a factor of 2 at epochs 100, 200, and 250, with a total of 300 epochs. In an implementation, the batch size is set to 256×256 with each batch containing 16 images.

Both branches first pass through a pixel unshuffling layer 2211, 2221 which implements a pixel unshuffling process on the input data. Pixel unshuffling is a process used in image processing to reconstruct a high-resolution image from a low-resolution image by rearranging or "unshuffling" the pixels. The process can involve the following steps, low-resolution input, pixel arrangement, interpolation, and enhancement. The input to the pixel unshuffling algorithm is a low-resolution image (i.e., decompressed, quantized SAR I/Q data). This image is typically obtained by downscaling a higher-resolution image such as during the encoding process executed by encoder 110. Pixel unshuffling aims to estimate the original high-resolution pixel values by redistributing and interpolating the low-resolution pixel values. The unshuffling process may involve performing interpolation techniques, such as nearest-neighbor, bilinear, or more sophisticated methods like bicubic or Lanczos interpolation, to estimate the missing pixel values and generate a higher-resolution image.

The output of the unshuffling layers 2211, 2221 may be fed into a series of layers which can include one or more convolutional layers and one or more parametric rectified linear unit (PReLU) layers. A legend is depicted for both FIG. 22A and FIG. 22B which indicates the cross hatched block represents a convolutional layer and the dashed block represents a PRELU layer. Convolution is the first layer to extract features from an input image. Convolution preserves the relationship between pixels by learning image features using small squares of input data. It is a mathematical operation that takes two inputs such as an image matrix and a filter or kernel. The embodiment features a cascaded ResNet-like structure comprising 8 ResBlocks to effectively process the input data. The filter size associated with each convolutional layer may be different. The filter size used for the pixel domain of the top branch may be different than the filter size used for the frequency domain of the bottom branch.

A PRELU layer is an activation function used in neural networks. The PRELU activation function extends the ReLU by introducing a parameter that allows the slope for negative values to be learned during training. The advantage of PRELU over ReLU is that it enables the network to capture more complex patterns and relationships in the data. By allowing a small negative slope for the negative inputs, the PRELU can learn to handle cases where the output should not be zero for all negative values, as is the case with the standard ReLU. In other implementations, other non-linear functions such as tanh or sigmoid can be used instead of PReLU.

After passing through a series of convolutional and PReLU layers, both branches enter the resnet 2230 which further comprises more convolutional and PRELU layers. The frequency domain branch is slightly different than the pixel domain branch once inside ResNet 2230, specifically the frequency domain is processed by a transposed convolutional (TConv) layer 2231. Transposed convolutions are a type of operation used in neural networks for tasks like image generation, image segmentation, and upsampling. They are used to increase the spatial resolution of feature maps while maintaining the learned relationships between features. Transposed convolutions aim to increase spatial dimensions of feature maps, effectively "upsampling" them. This is typically done by inserting zeros (or other values) between existing values to create more space for new values.

Inside ResBlock 2230 the data associated with the pixel and frequency domains are combined back into a single stream by using the output of the Tconv 2231 and the output of the top branch. The combined data may be used as input for a channel-wise transformer 2300. In some embodiments, the channel-wise transformer may be implemented as a multi-scale attention block utilizing the attention mechanism. For more detailed information about the architecture and functionality of channel-wise transformer 2300 refer to FIG. 23. The output of channel-wise transformer 2300 may be a bit stream suitable for reconstructing the original SAR I/Q image. FIG. 22B shows the output of ResBlock 2230 is passed through a final convolutional layer before being processed by a pixel shuffle layer 2240 which can perform upsampling on the data prior to image reconstruction. The output of the AI deblocking network may be passed through a quantizer 2124 for dequantization prior to producing a reconstructed SAR I/Q image 2250.

Figure 23:
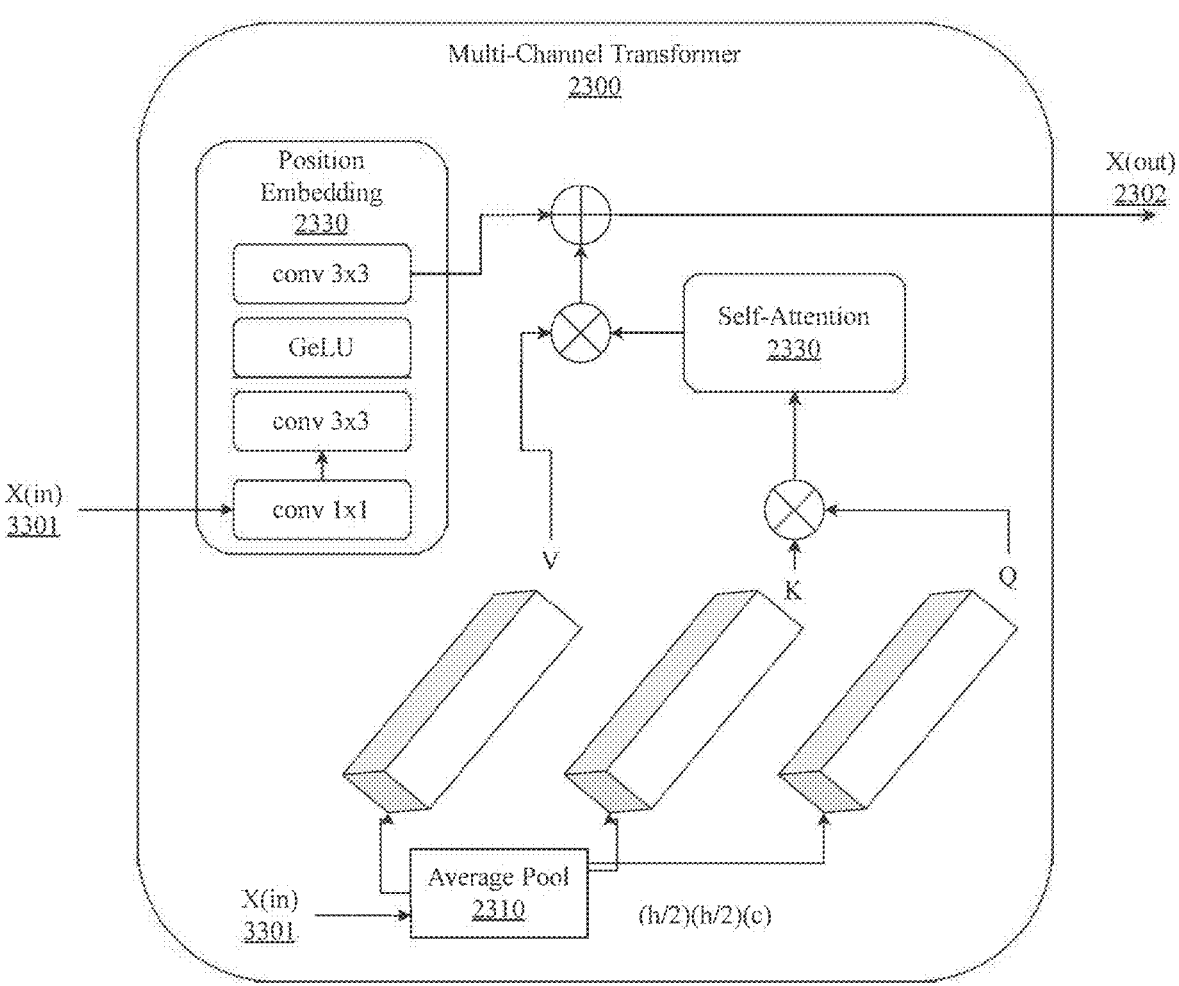
FIG. 23 is a block diagram illustrating an exemplary architecture for a component of the neural network-based compression or decompression subsystem, the channel-wise transformer.

FIG. 23 is a block diagram illustrating an exemplary architecture for a component of the system for SAR image compression, the channel-wise transformer 2300. According to the embodiment, channel-wise transformer receives an input signal, Xin 2301, the input signal comprising SAR I/Q data which is being processed by AI deblocking network 2123. The input signal may be copied and follow two paths through multi-channel transformer 2300.

A first path may process input data through a position embedding module 2330 comprising series of convolutional layers as well as a Gaussian Error Linear Unit (GeLU). In traditional recurrent neural networks or convolutional neural networks, the order of input elements is inherently encoded through the sequential or spatial nature of these architectures. However, in transformer-based models, where the attention mechanism allows for non-sequential relationships between tokens, the order of tokens needs to be explicitly conveyed to the model. Position embedding module 2330 may represent a feedforward neural network (position-wise feedforward layers) configured to add position embeddings to the input data to convey the spatial location or arrangement of pixels in an image. The output of position embedding module 2330 may be added to the output of the other processing path the received input signal is processed through.

A second path may process the input data. It may first be processed via a channel-wise configuration and then through a self-attention layer 2320. The signal may be copied/duplicated such that a copy of the received signal is passed through an average pool layer 2310 which can perform a downsampling operation on the input signal. It may be used to reduce the spatial dimensions (e.g., width and height) of feature maps while retaining the most important information. Average pooling functions by dividing the input feature map into non-overlapping rectangular or square regions (often referred to as pooling windows or filters) and replacing each region with the average of the values within that region. This functions to downsample the input by summarizing the information within each pooling window.

Self-attention layer 2320 may be configured to provide an attention to AI deblocking network 2123. The self-attention mechanism, also known as intra-attention or scaled dot-product attention, is a fundamental building block used in various deep learning models, particularly in transformer-based models. It plays a crucial role in capturing contextual relationships between different elements in a sequence or set of data, making it highly effective for tasks involving sequential or structured data like complex-valued SAR I/Q channels. Self-attention layer 320 allows each element in the input sequence to consider other elements and weigh their importance based on their relevance to the current element. This enables the model to capture dependencies between elements regardless of their positional distance, which is a limitation in traditional sequential models like RNNs and LSTMs.

The input 2301 and downsampled input sequence is transformed into three different representations: Query (Q), Key (K), and Value (V). These transformations ($w^V$, $w^K$, and $w^Q$) are typically linear projections of the original input. For each element in the sequence, the dot product between its Query and the Keys of all other elements is computed. The dot products are scaled by a factor to control the magnitude of the attention scores. The resulting scores may be normalized using a softmax function to get attention weights that represent the importance of each element to the current element. The Values (V) of all elements are combined using the attention weights as coefficients. This produces a weighted sum, where elements with higher attention weights contribute more to the final representation of the current element. The weighted sum is the output of the self-attention mechanism for the current element. This output captures contextual information from the entire input sequence.

The output of the two paths (i.e., position embedding module 2330 and self-attention layer 320) may be combined into a single output data stream $x_{out}$ 2302.

Detailed Description of Exemplary Aspects

Figure 24:
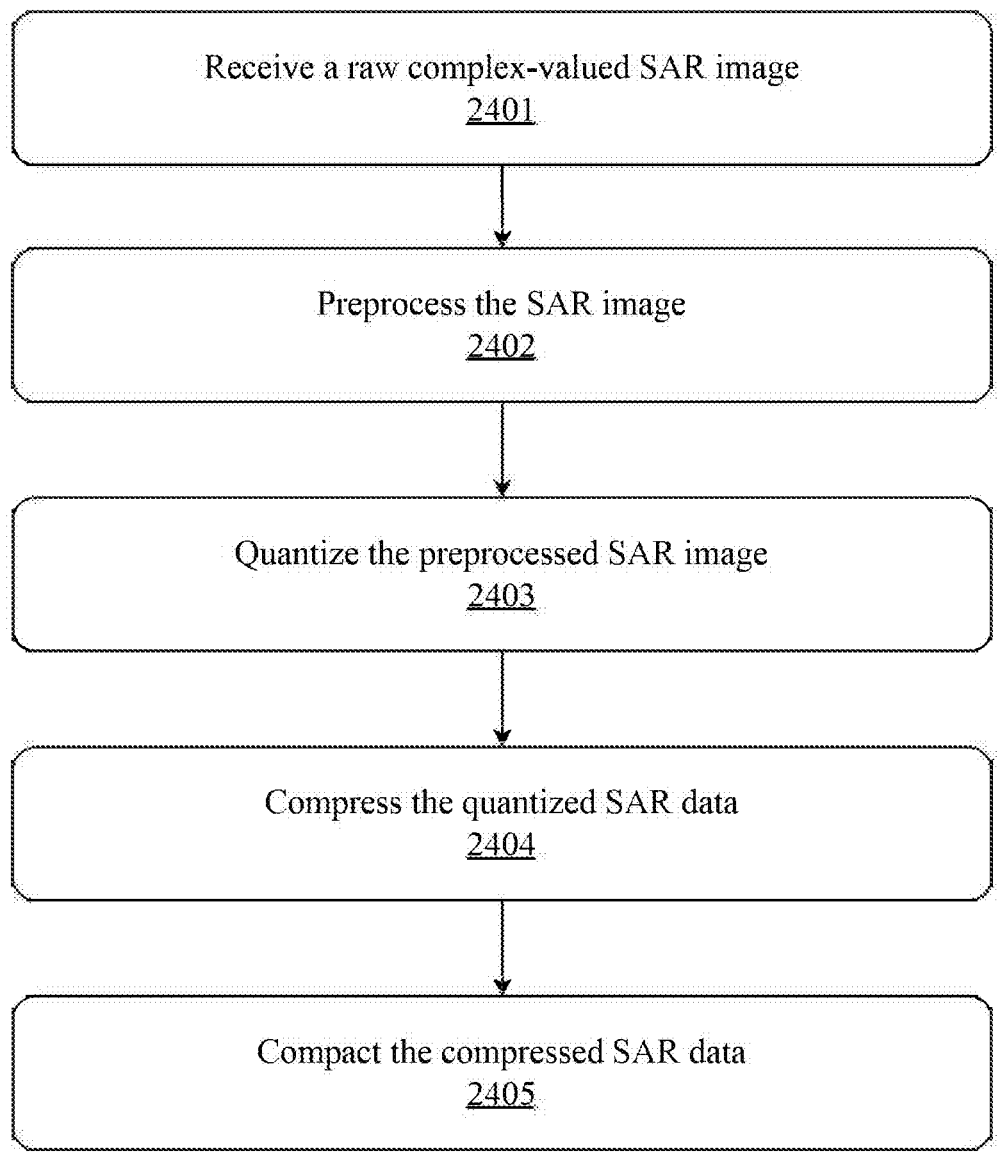
FIG. 24 is a flow diagram illustrating an exemplary method for a neural network-based compression or decompression subsystem, according to an embodiment.

FIG. 24 is a flow diagram illustrating an exemplary method 2400 for complex-valued SAR image compression, according to an embodiment. According to the embodiment, the process begins at step 2401 when encoder 2410 receives a raw complex-valued SAR image. The complex-valued SAR image comprises both I and Q components. In some embodiments, the I and Q components may be processed as separate channels. At step 2402, the received SAR image may be preprocessed for further processing by encoder 2110. For example, the input image may be clipped or otherwise transformed in order to facilitate further processing. As a next step 2403, the preprocessed data may be passed to quantizer 2112 which quantizes the data. The next step 2404, comprises compressing the quantized SAR data using a compression algorithm known to those with skill in the art. In an embodiment, the compression algorithm may comprise HEVC encoding for both compression and decompression of SAR data. As a last step 2405, the compressed data may be compacted. The compaction may be a lossless compaction technique. The output of method 2400 is a compressed, compacted bit stream of SAR image data which can be stored in a database, requiring much less storage space than would be required to store the original, raw SAR image. The compressed and compacted bit stream may be transmitted to an endpoint for storage or processing. Transmission of the compressed and compacted data require less bandwidth and computing resources than transmitting raw SAR image data.

Figure 25:
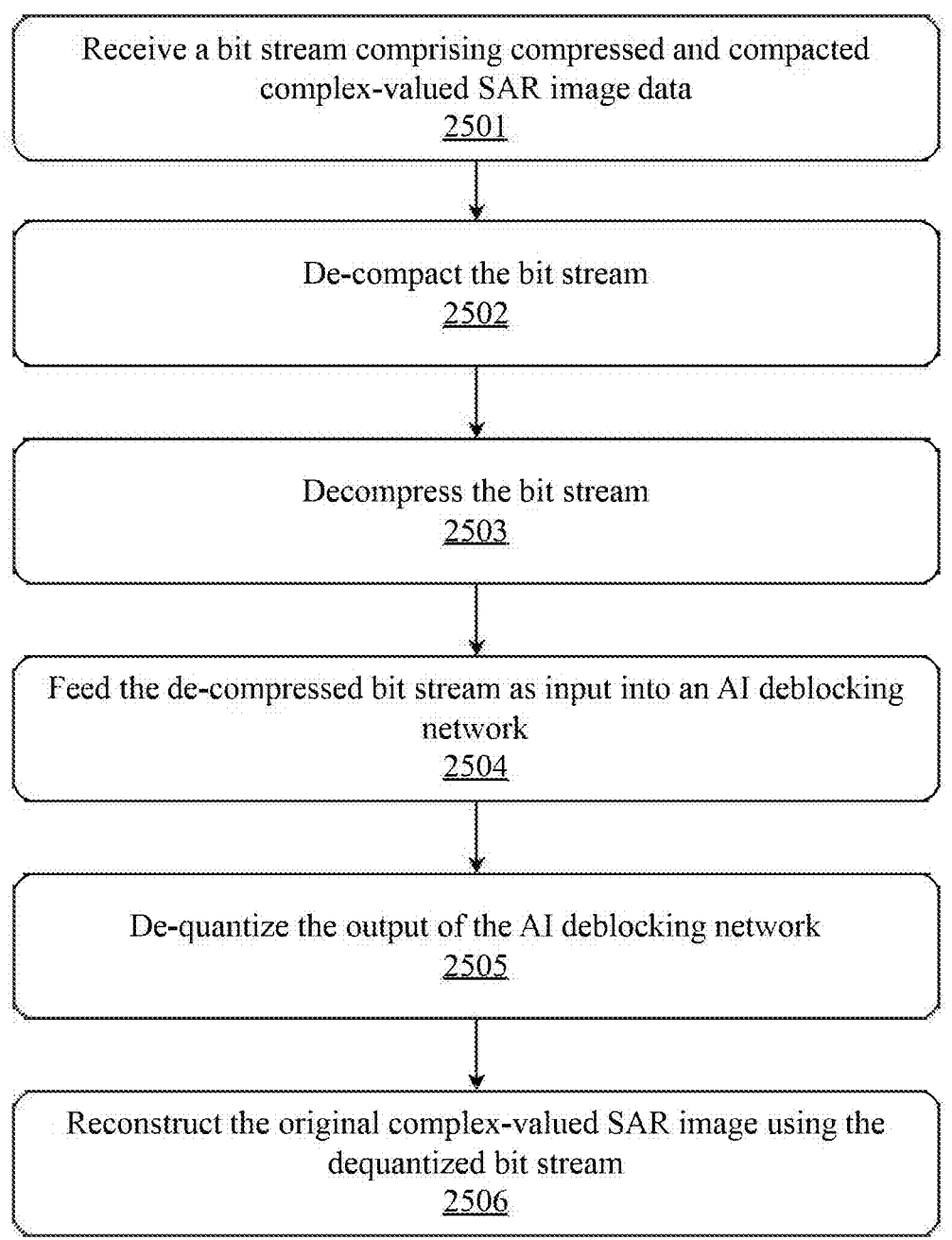
FIG. 25 is a flow diagram illustrating and exemplary method for a neural network-based compression or decompression subsystem, according to an embodiment.

FIG. 25 is a flow diagram illustrating and exemplary method 2500 for decompression of a complex-valued SAR image, according to an embodiment. According to the embodiment, the process begins at step 2501 when decoder 2120 receives a bit stream comprising compressed and compacted complex-valued SAR image data. The compressed bit stream may be received from encoder 2110 or from a suitable data storage device. At step 2502, the received bit stream is first de-compacted to produce an encoded (compressed) bit stream. In some embodiments, a data reconstruction engine may be implemented as a system for de-compacting a received bit stream. The next step 2503, comprising decompressing the de-compacted bit stream using a suitable compression algorithm known to those with skill in the art, such as HEVC encoding. At step 2504, the de-compressed SAR data may be fed as input into AI deblocking network 2123 for image enhancement via a trained deep learning network. The AI deblocking network may utilize a series of convolutional layers and/or Res-Blocks to process the input data and perform artifact removal on the de-compressed SAR image data. AI deblocking network may be further configured to implement an attention mechanism for the model to capture dependencies between elements regardless of their positional distance. In an embodiment, during training of AI deblocking network, the amplitude loss in conjunction with the SAR loss may be computed and accounted for, further boosting the compression performance of system 2100. The output of AI deblocking network 123 can be sent to a quantizer 2124 which can execute step 2505 by de-quantizing the output bit stream from AI deblocking network. As a last step 2506, system can reconstruct the original complex-valued SAR image using the de-quantized bit stream.

FIG. 26 is a flow diagram illustrating an exemplary method for deblocking using a trained deep learning algorithm, according to an embodiment. According to the embodiment, the process begins at step 2601 wherein the trained deep learning algorithm (i.e., AI deblocking network 2123) receives a decompressed bit stream comprising SAR I/Q image data. At step 2602, the bit stream is split into a pixel domain and a frequency domain. Each domain may pass through AI deblocking network, but have separate, almost similar processing paths. As a next step 2603, each domain is processed through its respective branch, the branch comprising a series of convolutional layers and ResBlocks. In some implementations, frequency domain may be further processed by a transpose convolution layer. The two branches are combined and used as input for a multi-channel transformer with attention mechanism at step 2604. Multi-channel transformer 2300 may perform functions such as downsampling, positional embedding, and various transformations, according to some embodiments. Multi-channel transformer 2300 may comprise one or more of the following components: channel-wise attention, transformer self-attention, and/or feedforward layers. In an implementation, the downsampling may be performed via average pooling. As a next step 2605, the AI deblocking network processes the output of the channel-wise transformer. The processing may include the steps of passing output through one or more convolutional or PRELU layers and/or upsampling the output. As a last step 2606, the processed output may be forwarded to quantizer 2124 or some other endpoint for storage or further processing.

Figure 27A:
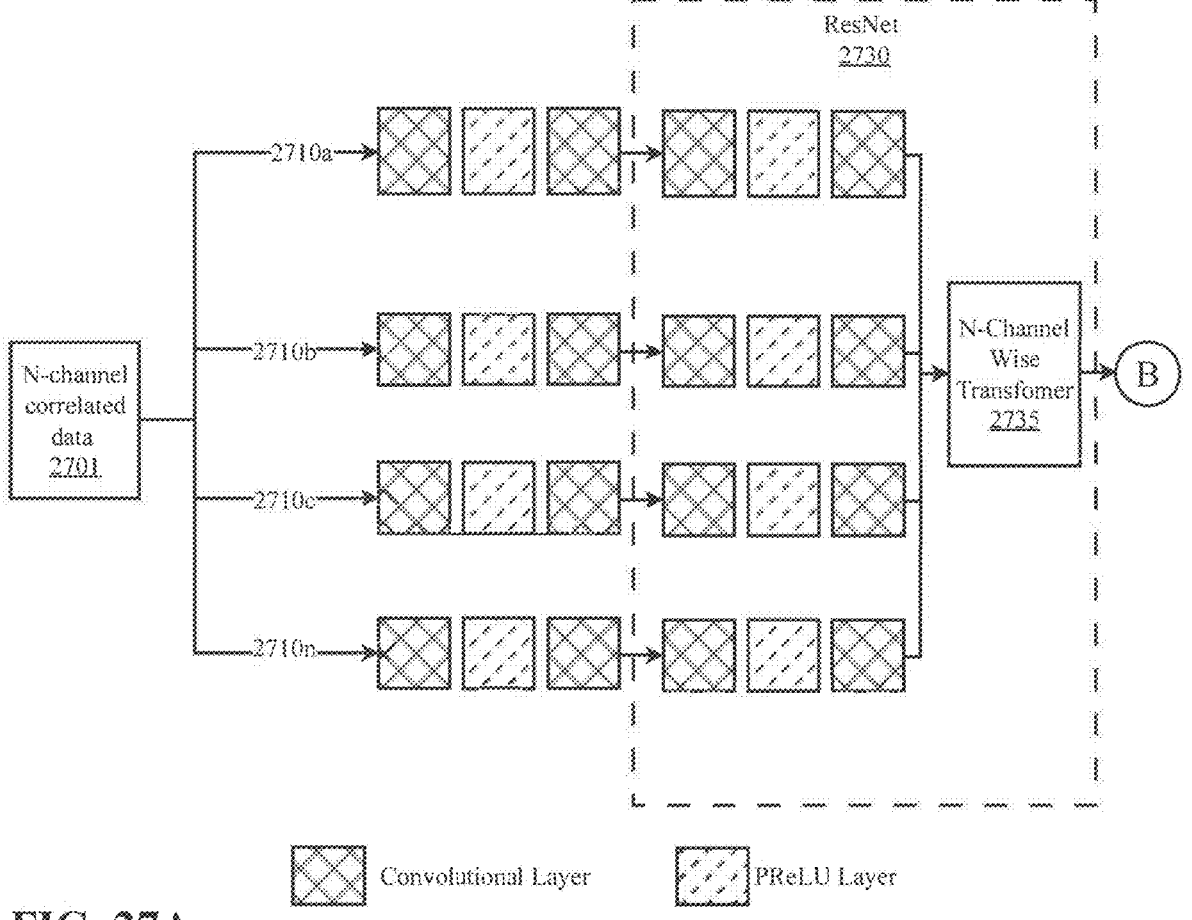

FIGS. 27A and 27B illustrate an exemplary architecture for an AI deblocking network configured to provide deblocking for a general N-channel data stream, according to an embodiment. The term "N-channel" refers to data that is composed of multiple distinct channels of modalities, where each channel represents a different aspect of type of information. These channels can exist in various forms, such as sensor readings, image color channels, or data streams, and they are often used together to provide a more comprehensive understanding of the underlying phenomenon. Examples of N-channel data include, but is not limited to, RGB images (e.g., in digital images, the red, green, and blue channels represent different color information; combining these channels allows for the representation of a wide range of colors), medical imaging (e.g., may include Magnetic Resonance Imaging scans with multiple channels representing different tissue properties, or Computed Tomography scans with channels for various types of X-ray attenuation), audio data (e.g., stereo or multi-channel audio recordings where each channel corresponds to a different microphone or audio source), radar and lidar (e.g., in autonomous vehicles, radar and lidar sensors provide multi-channel data, with each channel capturing information about objects' positions, distances, and reflectivity) SAR image data, text data (e.g., in natural language processing, N-channel data might involve multiple sources of text, such as social media posts and news articles, each treated as a separate channel to capture different textual contexts), sensor networks (e.g., environmental monitoring systems often employ sensor networks with multiple sensors measuring various parameters like temperature, humidity, air quality, and more. Each sensor represents a channel), climate data, financial data, and social network data.

The disclosed AI deblocking network may be trained to process any type of N-channel data, if the N-channel data has a degree of correlation. More correlation between and among the multiple channels yields a more robust and accurate AI deblocking network capable of performing high quality compression artifact removal on the N-channel data stream. A high degree of correlation implies a strong relationship between channels. Using SAR image data has been used herein as an exemplary use case for an AI deblocking network for a N-channel data stream comprising 2 channels, the In-phase and Quadrature components (i.e., I and Q, respectively).

Exemplary data correlations that can be exploited in various implementations of AI deblocking network can include, but are not limited to, spatial correlation, temporal correlation, cross-sectional correlation (e.g., This occurs when different variables measured at the same point in time are related to each other), longitudinal correlation, categorical correlation, rank correlation, time-space correlation, functional correlation, and frequency domain correlation, to name a few.

As shown, an N-channel AI deblocking network may comprise a plurality of branches 2710*a-n*. The number of branches is determined by the number of channels associated with the data stream. Each branch may initially be processed by a series of convolutional and PRELU layers. Each branch may be processed by resnet 2730 wherein each branch is combined back into a single data stream before being input to N-channel wise transformer 2735, which may be a specific configuration of transformer 2300. The output of N-channel wise transformer 2735 may be sent through a final convolutional layer before passing through a last pixel shuffle layer 2740. The output of AI deblocking network for N-channel video/image data is the reconstructed N-channel data 2750.

As an exemplary use case, video/image data may be processed as a 3-channel data stream comprising Green (G), Red (R), and Blue (B) channels. An AI deblocking network may be trained that provides compression artifact removal of video/image data. Such a network would comprise 3 branches, wherein each branch is configured to process one of the three channels (R,G, or B). For example, branch 2710*a* may correspond to the R-channel, branch 2710*b* to the G-channel, and branch 2710*c* to the B-channel. Each of these channels may be processed separately via their respective branches before being combined back together inside resnet 2730 prior to being processed by N-channel wise transformer 2735.

As another exemplary use case, a sensor network comprising a half dozen sensors may be processed as a 6-channel data stream. The exemplary sensor network may include various types of sensors collecting different types of, but still correlated, data. For example, sensor networks can include a pressure sensor, a thermal sensor, a barometer, a wind speed sensor, a humidity sensor, and an air quality sensor. These sensors may be correlated to one another in at least one way. For example, the six sensors in the sensor network may be correlated both temporally and spatially, wherein each sensor provides a time series data stream which can be processed by one of the 6 channels 2710*a-n* of AI deblocking network. As long as AI deblocking network is trained on N-channel data with a high degree of correlation and which is representative of the N-channel data it will encounter during model deployment, it can reconstruct the original data using the methods described herein.

Figure 28:
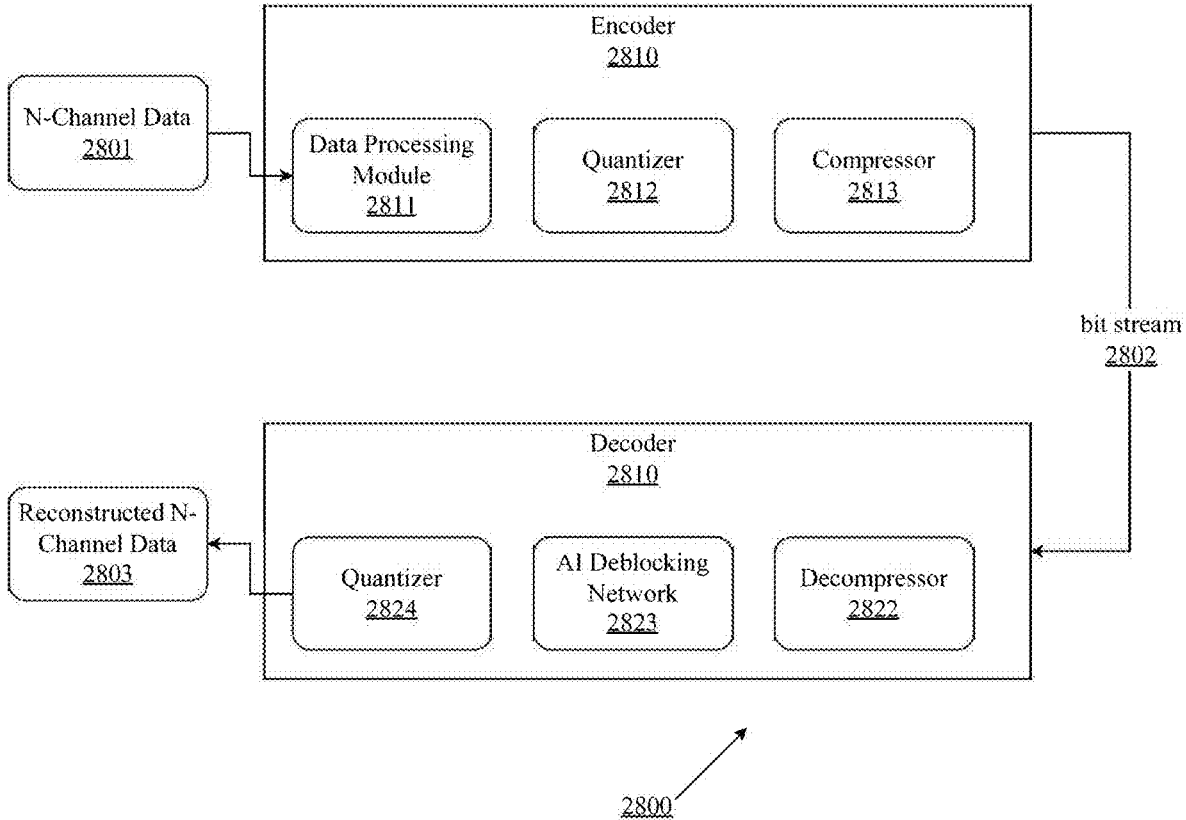
FIG. 28 is a block diagram illustrating an exemplary system architecture for N-channel data compression with predictive recovery, according to an embodiment.

FIG. 28 is a block diagram illustrating an exemplary system architecture 2800 for N-channel data compression with predictive recovery, according to an embodiment. According to the embodiment, the system 2800 comprises an encoder module 2810 configured to receive as input N-channel data 2801 and compress and compact the input data into a bitstream 2102, and a decoder module 2120 configured to receive and decompress the bitstream 2802 to output a reconstructed N-channel data 2803.

A data processor module 2811 may be present and configured to apply one or more data processing techniques to the raw input data to prepare the data for further processing by encoder 2810. Data processing techniques can include (but are not limited to) any one or more of data cleaning, data transformation, encoding, dimensionality reduction, data slitting, and/or the like.

After data processing, a quantizer 2812 performs uniform quantization on the n-number of channels. Quantization is a process used in various fields, including signal processing, data compression, and digital image processing, to represent continuous or analog data using a discrete set of values. It involves mapping a range of values to a smaller set of discrete values. Quantization is commonly employed to reduce the storage requirements or computational complexity of digital data while maintaining an acceptable level of fidelity or accuracy. Compressor 2813 may be configured to perform data compression on quantized N-channel data using a suitable conventional compression algorithm.

At the endpoint which receives the transmitted compacted bitstream 2802 may be decoder module 2820 configured to restore the compacted data into the original SAR image by essentially reversing the process conducted at encoder module 2810. The received bitstream may first be (optionally) passed through a lossless compactor which de-compacts the data into an encoded bitstream. In an embodiment, a data reconstruction engine may be implemented to restore the compacted bitstream into its encoded format. The encoded bitstream may flow from compactor to decompressor 2822 wherein a data compaction technique may be used to decompress the encoded bitstream into the I/Q channels. It should be appreciated that lossless compactor components are optional components of the system and may or may not be present in the system, dependent upon the embodiment.

According to the embodiment, an Artificial Intelligence (AI) deblocking network 2823 is present and configured to utilize a trained deep learning network to provide compression artifact removal as part of the decoding process. AI deblocking network 2823 may leverage the relationship demonstrated between the various N-channels of a data stream to enhance the reconstructed N-channel data 2803. Effectively, AI deblocking network 2823 provides an improved and novel method for removing compression artifacts that occur during lossy compression/decompression using a network designed during the training process to simultaneously address the removal of artifacts and maintain fidelity of the original N-channel data signal, ensuring a comprehensive optimization of the network during the training stages.

The output of AI deblocking network 2823 may be dequantized by quantizer 2824, restoring the n-channels to their initial dynamic range. The dequantized n-channel data may be reconstructed and output 32803 by decoder module 2820 or stored in a database.

FIG. 29 is a flow diagram illustrating an exemplary method for processing a compressed n-channel bit stream using an AI deblocking network, according to an embodiment. According to the embodiment, the process begins at step 2901 when a decoder module 2820 receives, retrieves, or otherwise obtains a bit stream comprising n-channel data with a high degree of correlation. At step 2902, the bit stream is split into an n-number of domains. For example, if the received bit stream comprises image data in the form of R-,G,- and B-channels, then the bit stream would be split into 3 domains, one for each color (RGB). At step 2903, each domain is processed through a branch comprising a series of convolutional layers and ResBlocks. The number of layers and composition of said layers may depend upon the embodiment and the n-channel data being processed. At step 2904, the output of each branch is combined back into a single bitstream and used as an input into an n-channel wise transformer 2735. At step 2905, the output of the channel-wise transformer may be processed through one or more convolutional layers and/or transformation layers, according to various implementations. At step 2906, the processed output may be sent to a quantizer for upscaling and other data processing tasks. As a last step 2907, the bit stream may be reconstructed into its original uncompressed form.

Figure 30:
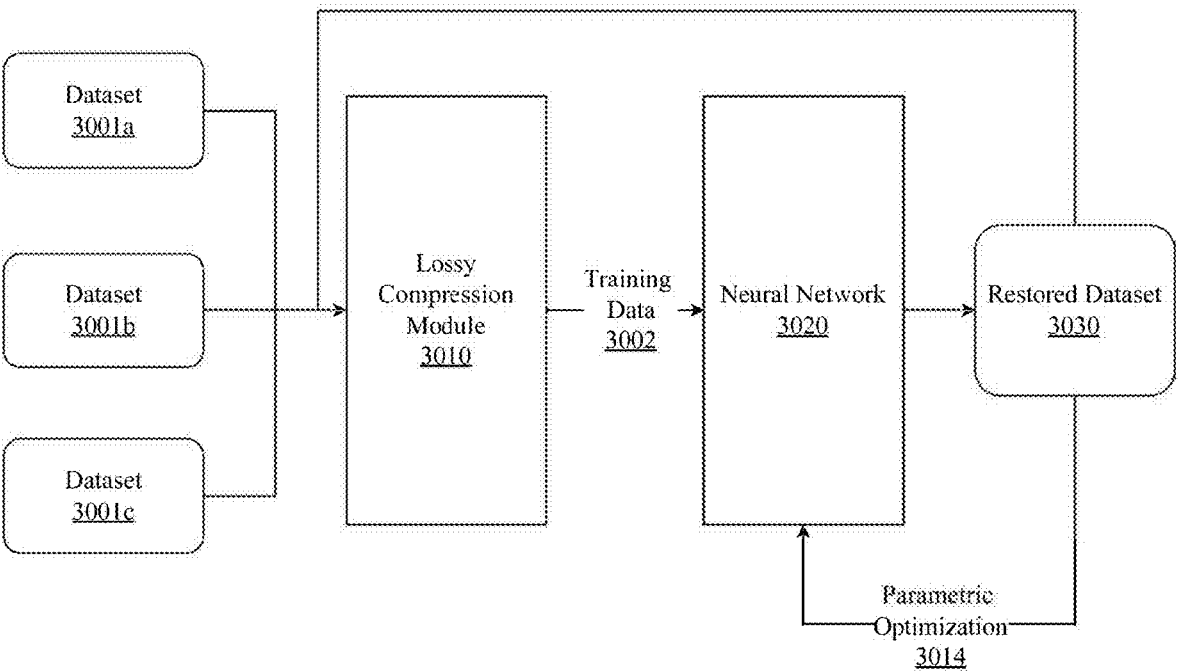
FIG. 30 is a block diagram illustrating a system for training a neural network to perform upsampling of decompressed data after lossy compression, according to an embodiment.

FIG. 30 is a block diagram illustrating a system for training a neural network to perform upsampling of decompressed data after lossy compression, according to an embodiment. The neural network may be referred to herein as a neural upsampler. According to the embodiment, a neural upsampler 3030 may be trained by taking training data 3002 which may comprise sets of two or more correlated datasets 2101*a-n* and performing whatever processing that is done to compress the data. This processing is dependent upon the type of data and may be different in various embodiments of the disclosed system and methods. For example, in the SAR imagery use case, the processing and lossy compression steps used quantization and HEVC compression of the I and Q images. The sets of compressed data may be used as input training data 3002 into the neural network 3020 wherein the target output is the original uncompressed data. Because there is correlation between the two or more datasets, the neural upsampler learns how to restore "lost" data by leveraging the cross-correlations.

For each type of input data, there may be different compression techniques used, and different data conditioning for feeding into the neural upsampler. For example, if the input datasets 2101*a-n* comprise a half dozen correlated time series from six sensors arranged on a machine, then delta encoding, or a swinging door algorithm may be implemented for data compression and processing.

The neural network 3020 may process the training data 3002 to generate model training output in the form of restored dataset 3030. The neural network output may be compared against the original dataset to check the model's precision and performance. If the model output does not satisfy a given criteria or some performance threshold, then parametric optimization 3015 may occur wherein the training parameters and/or network hyperparameters may be updated and applied to the next round of neural network training.

FIG. 31 is a flow diagram illustrating an exemplary method 3100 for training a neural network to perform upsampling of decompressed data after lossy compression, according to an embodiment. According to an embodiment, the process begins at step 3101 by creating a training dataset comprising compressed data by performing lossy compression on two or more datasets which are substantially correlated. As a next step 3102, the training dataset is used to train a neural network (i.e., neural upsampler) configured to leverage the correlation between the two or more datasets to generate as output a reconstructed dataset. At step 3103, the output of the neural network is compared to the original two more datasets to determine if the performance of the neural network at reconstructing the compressed data. If the model performance is not satisfactory, which may be determined by a set of criteria or some performance metric or threshold, then the neural network model parameters and/or hyperparameters may be updated 3104 and applied to the next round of training as the process moves to step 3102 and iterates through the method again.

Figure 32:
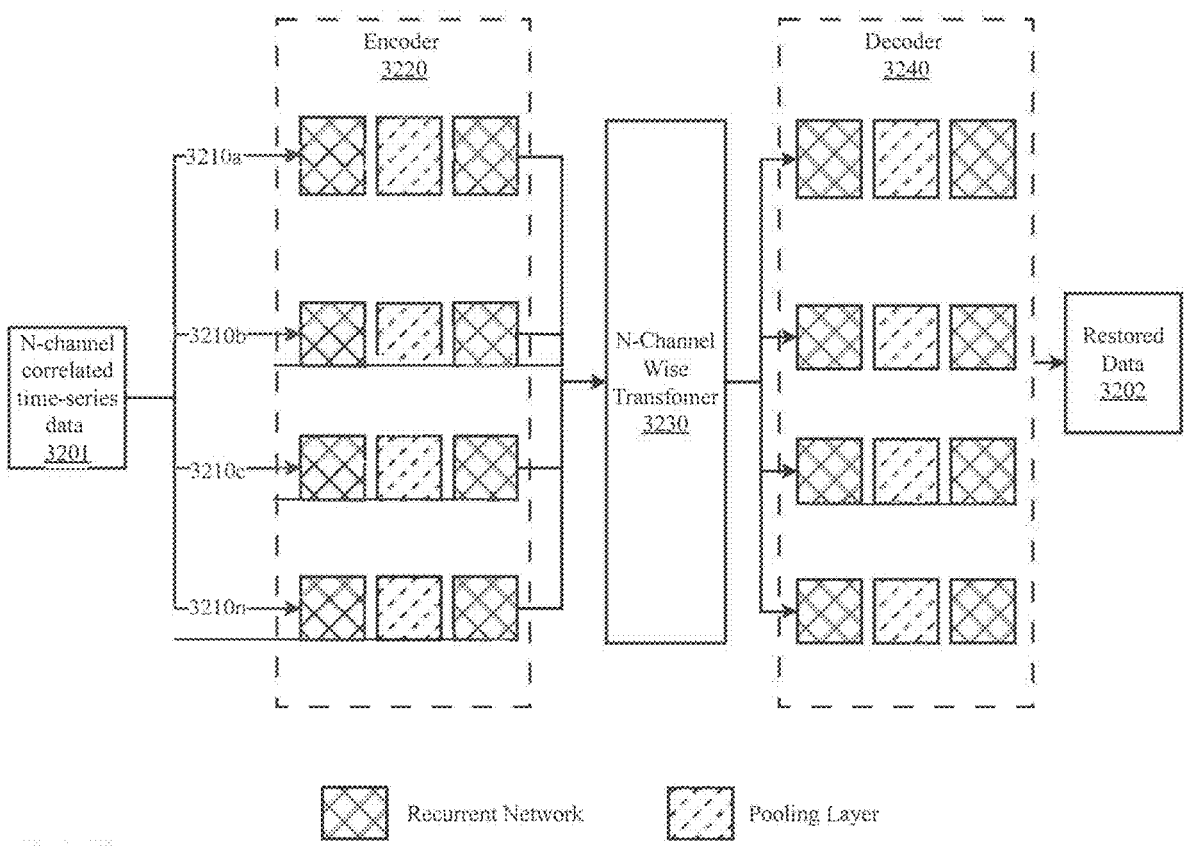
FIG. 32 is a block diagram illustrating an exemplary architecture for a neural upsampler configured to process N-channel time-series data, according to an embodiment.

FIG. 32 is a block diagram illustrating an exemplary architecture for a neural upsampler configured to process N-channel time-series data, according to an embodiment. The neural upsampler may comprise a trained deep learning algorithm. According to the embodiment, a neural upsampler configured to process time-series data may comprise a recurrent autoencoder with an n-channel transformer attention network. In such an embodiment, the neural upsampler may be trained to process decompressed time-series data wherein the output of the upsampler is restored time-series data (i.e., restore most of the lost data due to the lossy compression). The upsampler may receive decompressed n-channel time-series data comprising two or more data sets of time-series data which are substantially correlated. For example, the two or more data sets may comprise multiple sets of Internet of Things (IoT) sensor data from sensors that are likely to be temporally correlated. For instance, consider a large number of sensors on a single complex machine (e.g., a combine tractor, a 3D printer, construction equipment, etc.) or a large number of sensors in a complex system such as a pipeline or refinery.

The n-channel time-series data may be received split into separate channels $3210a\text{-}n$ to be processed individually by encoder 3220. In some embodiments, encoder 3220 may employ a series of various data processing layers which may comprise recurrent neural network (RNN) layers, pooling layers, PRELU layers, and/or the like. In some implementations, one or more of the RNN layers may comprise a Long Short-Term Memory (LSTM) network. In some implementations, one or more of the RNN layers may comprise a sequence-to-sequence model. In yet another implementation, the one or more RNN layer may comprise a gate recurrent unit (GRU). Each channel may be processed by its own series of network layers wherein the encoder 3220 can learn a representation of the input data which can be used to determine the defining features of the input data. Each individual channel then feeds into an n-channel wise transformer 3230 which can learn the interdependencies between the two or more channels of correlated time-series data. The output of the n-channel wise transformer 3230 is fed into the decoder 3240 component of the recurrent autoencoder in order to restore missing data lost due to a lossy compression implemented on the time-series data. N-channel wise transformer 3230 is designed so that it can weigh the importance of different parts of the input data and then capture long-range dependencies between and among the input data. The decoder may process the output of the n-channel wise transformer 3230 into separate channels comprising various layers as described above. The output of decoder 3240 is the restored time-series data 3202, wherein most of the data which was "lost" during lossy compression can be recovered using the neural upsampler which leverages the interdependencies hidden within correlated datasets.

In addition to RNNs and their variants, other neural network architectures like CNNs and hybrid models that combine CNNs and RNNs can also be implemented for processing time series and sensor data, particularly when dealing with sensor data that can be structured as images or spectrograms. For example, if you had, say, 128 time series streams, it could be structured as two 64×64-pixel images (64 times series each, each with 64 time steps), and then use the same approach as the described above with respect to the SAR image use case. In an embodiment, a one-dimensional CNN can be used as a data processing layer in encoder 3220 and/or decoder 3240. The selection of the neural network architecture for time series data processing may be based on various factors including, but not limited to, the length of the input sequences, the frequency and regularity of the data points, the need to handle multivariate input data, the presence of exogenous variables or covariates, the computational resources available, and/or the like.

The exemplary time-series neural upsampler described in FIG. 32 may be trained on a training dataset comprising a plurality of compressed time-series data sourced from two or more datasets which are substantially correlated. For example, in a use case directed towards neural upsampling of IoT sensor data, the neural upsampler may be trained on a dataset comprising compressed IoT sensor data. During training, the output of the neural upsampler may be compared against the non-compressed version of the IoT sensor data to determine the neural upsampler's performance on restoring lost information.

Figure 33:
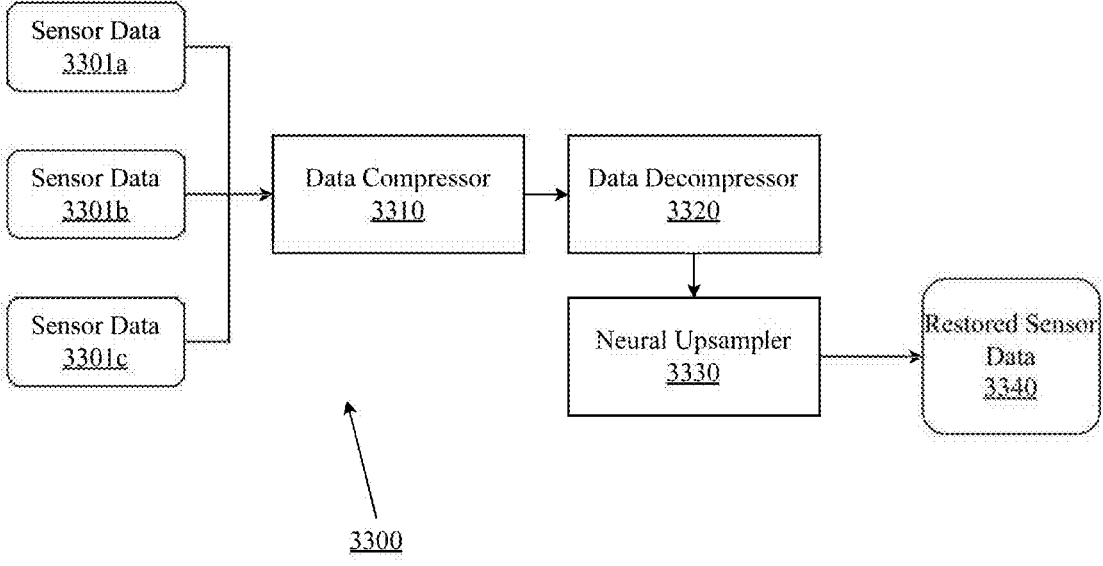
FIG. 33 is a block diagram illustrating an exemplary system architecture for upsampling of decompressed sensor data after lossy compression using a neural network, according to an embodiment.

FIG. 33 is a block diagram illustrating an exemplary system architecture 3300 for upsampling of decompressed sensor data after lossy compression using a neural network, according to an embodiment. According to the embodiment, a neural upsampler 3330 is present and configured to receive decompressed sensor data (e.g., time-series data obtained from an IoT device) and restore the decompressed data by leveraging learned data correlations and inter- and intra-dependencies. According to an embodiment, the system may receive a plurality of sensor data $3301a\text{-}n$ from two or more sensors/devices, wherein the sensor data are substantially correlated. In an embodiment, the plurality of sensor data $3301a\text{-}n$ comprises time-series data. Time-series data received from two or more sensors may be temporally correlated, for example, IoT data from a personal fitness device and a blood glucose monitoring device during the time when a user of both devices is exercising may be correlated in time and by heart rate. As another example, a large number of sensors used to monitor a manufacturing facility may be correlated temporally.

A data compressor 3310 is present and configured to utilize one or more data compression methods on received sensor data $3301a\text{-}n$. The data compression method chosen must be a lossy compression method. Exemplary types of lossy compression that may be used in some embodiments may be directed towards image or audio compression such as JPEG and MP3, respectively. For time series data lossy compression methods that may be implemented include (but is not limited to) one or more of the following: delta encoding, swinging door algorithm, batching, data aggregation, feature extraction. In an implementation, data compressor 3310 may implement network protocols specific for IoT such as message queuing telemetry transport (MQTT) for supporting message compression on the application layer and/or constrained application protocol (CoAP) which supports constrained nodes and networks and can be used with compression.

The compressed multi-channel sensor data $3301a\text{-}n$ may be decompressed by a data decompressor 3320 which can utilize one or more data decompression methods known to those with skill in the art. The output of data decompressor 3320 is a sensor data stream(s) of decompressed data which is missing information due to the lossy nature of the compression/decompression methods used. The decompressed sensor data stream(s) may be passed to neural upsampler 3330 which can utilize a trained neural network to restore most of the "lost" information associated with the decompressed sensor data stream(s) by leveraging the learned correlation(s) between and among the various sensor data streams. The output of neural upsampler 3330 is restored sensor data 3340.

Figure 34:
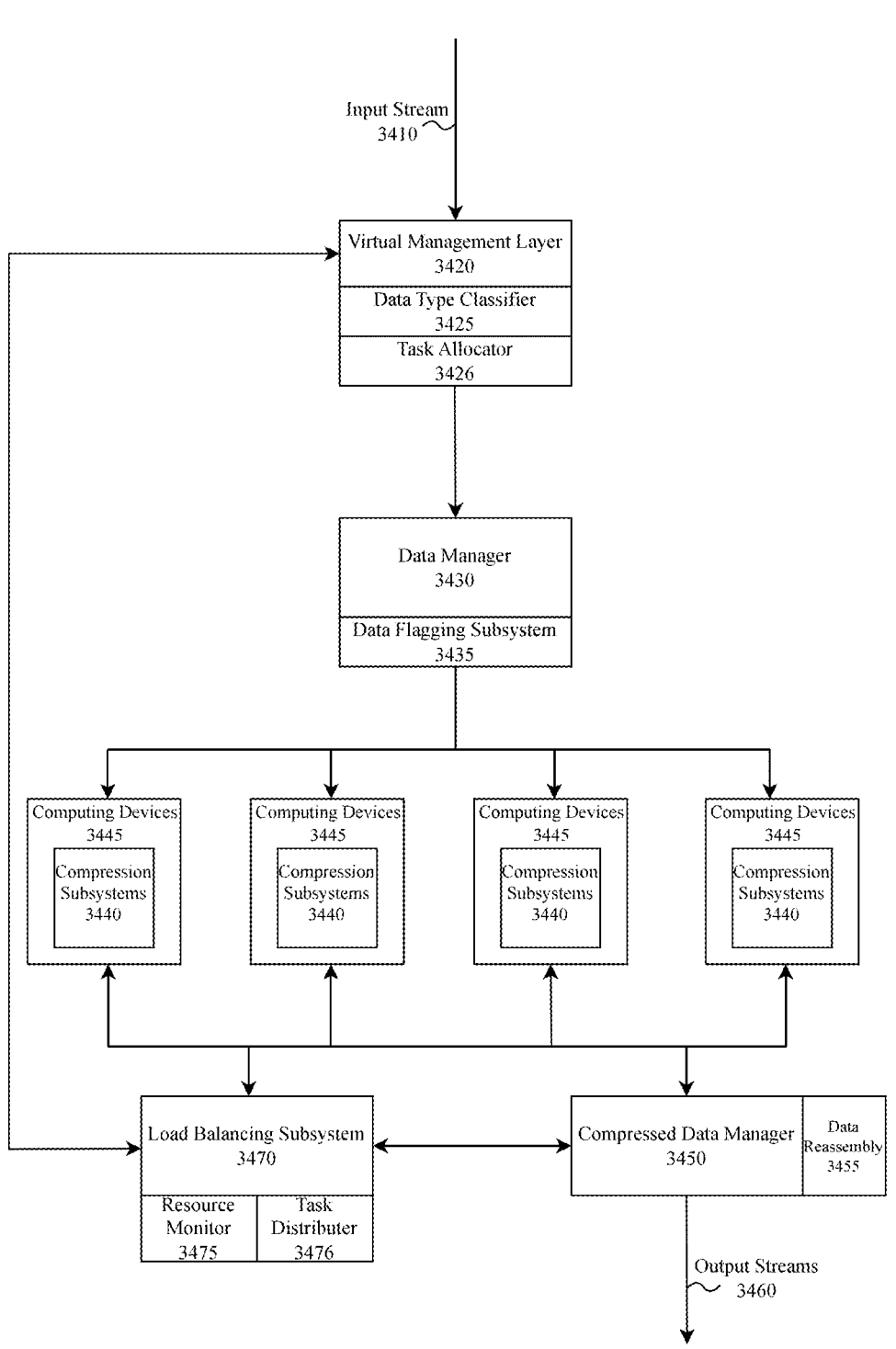
FIG. 34 is a block diagram illustrating exemplary architecture of distributed architecture system.

FIG. 34 is a block diagram illustrating exemplary architecture of distributed architecture system 3400. Distributed architecture system 3400 comprises input stream 3410, virtual management layer 3420, data manager 3430, compression subsystems 3440, compressed data manager 3450, output streams 3460, and load balancing subsystem 3470. Virtual management layer 3420 includes data type classifier 3425 and task allocator 3426. Data manager 3430 includes data flagging subsystem 3435. Compression subsystems 3440 are distributed across multiple computing devices

3445. Compressed data manager 3450 includes data reassembly subsystem 3455. Load balancing subsystem 3470 includes resource monitor 3475 and task distributor 3476.

Input stream 3410 receives data from various sources including text, images, audio, video, structured data, scientific data, genomic data, and point cloud data. For example, satellite systems may provide both image data and corresponding metadata. Input stream 3410 feeds this diverse data into virtual management layer 3420. Data type classifier 3425 within virtual management layer 3420 analyzes incoming data and categorizes it into different data types such as text, images, audio, or video. Task allocator 3426 then determines which compression subsystem is best suited for each data type and prepares to distribute the tasks.

Data manager 3430 receives the categorized data from virtual management layer 3420. Data flagging subsystem 3435 applies markers or flags to associated data sets, ensuring related data can be identified and regrouped after compression, even when processed on different devices.

Compression subsystems 3440 are distributed across multiple computing devices 3445. Each subsystem is optimized for specific data types and compression techniques. These subsystems receive data from data manager 3430 and perform compression operations.

Load balancing subsystem 3470 works in conjunction with virtual management layer 3420 to optimize task distribution across computing devices 3445. Resource monitor 3475 continuously tracks the workload and capacity of each device, while task distributor 3476 allocates compression tasks based on this information.

After compression, data flows to compressed data manager 3450. Data reassembly subsystem 3455 regroups associated data sets that were flagged by data flagging subsystem 3435, ensuring related data is reunited regardless of which devices performed the compression.

Finally, compressed and reassembled data is organized into output streams 3460, ready for storage or further processing. This distributed architecture allows for parallel processing of multiple data types, improving overall system efficiency and scalability.

The distributed nature of system 3400 builds upon the existing multi-type data compression system described in FIG. 1, enhancing its capabilities to handle larger volumes of data and process multiple data types simultaneously. It integrates seamlessly with the previously described virtual management layer and compression subsystems, extending their functionality across multiple computing devices.

In a non-limiting use case example, distributed architecture system 3400 may be utilized by a large-scale earth observation satellite network. This network generates vast amounts of diverse data types, including high-resolution imagery, multispectral data, and associated metadata. As the satellite network captures data, it transmits this information to ground stations, which then feed it into input stream 3410 of system 3400. The incoming data includes high-resolution images of Earth's surface, spectral information from various wavelengths, and metadata containing satellite position, time stamps, and sensor calibration information. Virtual management layer 3420 receives this influx of data. Data type classifier 3425 identifies the different components: image data, spectral data, and metadata. Task allocator 3426 then determines the most suitable compression techniques for each data type.

Data manager 3430 applies flags to the data, ensuring that images, their corresponding spectral data, and metadata remain associated throughout the compression process. This flagging is crucial as different data types may be processed on separate devices. Load balancing subsystem 3470 assesses the current workload across the network's computing devices 3445. It might, for instance, direct image data to devices with powerful GPUs, while sending metadata to CPU-optimized machines.

Compression subsystems 3440 then process the data. Image and spectral data might undergo lossy compression using techniques like wavelet transforms, while metadata is compressed using lossless methods to preserve its integrity. After compression, compressed data manager 3450 reassembles the processed data, ensuring that compressed images are paired with their corresponding compressed spectral data and metadata.

The resulting output streams 3460 contain efficiently compressed satellite data, significantly reducing storage and transmission requirements while maintaining data relationships. This compressed data can then be easily stored, transmitted to research institutions, or used for various earth observation applications.

This use case demonstrates how system 3400 can handle complex, multi-type data from a satellite network, efficiently processing and compressing it in a distributed manner.

FIG. 35 is a method diagram illustrating the use of distributed architecture system 3400. The method begins by receiving input data streams containing various data types at input stream 3410. 3501 These streams are then analyzed and categorized into different data types using data type classifier 3425, while task allocator 3426 within virtual management layer 3420 determines the appropriate compression subsystems for each data type. 3502 Data flagging subsystem 3435 within data manager 3430 applies flags or markers to associated data sets to maintain their relationships throughout the process. 3503 Load balancing subsystem 3470 monitors the resource availability and current workload of computing devices 3445, distributing compression tasks accordingly to optimize system performance. 3504 Compression operations are then performed on the distributed data sets using compression subsystems 3440 across multiple computing devices 3445. 3505 Once compression is complete, compressed data manager 3450 collects the compressed data from the various computing devices. 3506 Data reassembly subsystem 3455 then reassembles the associated data sets based on the previously applied flags, ensuring related data remains grouped together. 3507 The reassembled, compressed data is organized into output streams 3460. 3508 Finally, the compressed data streams are output for storage or further processing, completing the distributed compression process. 3509

Exemplary Computing Environment

Figure 36:
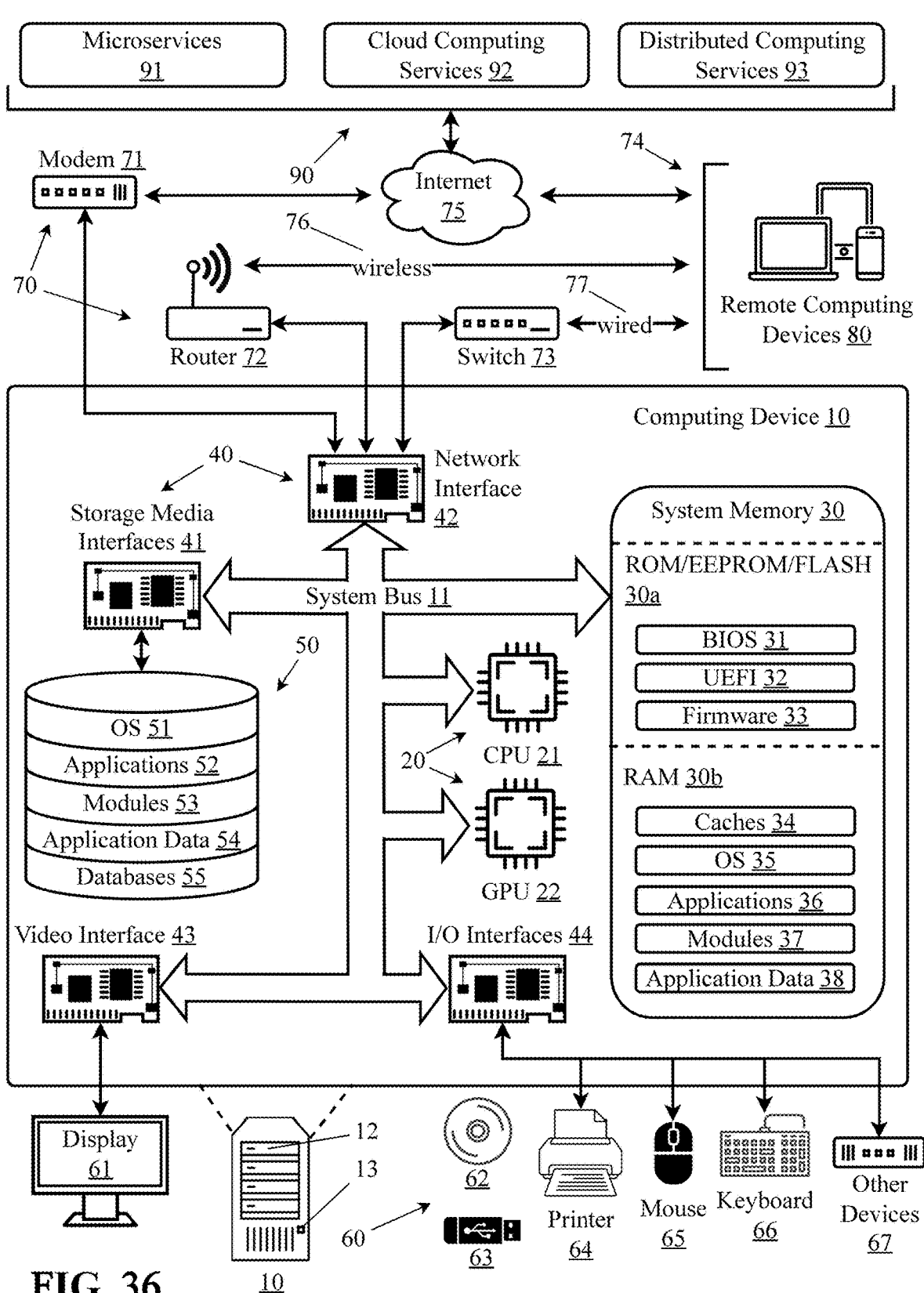
FIG. 36 illustrates an exemplary computing environment on which an embodiment described herein may be implemented, in full or in part.

FIG. 36 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing) those instructions to perform computer operations such as retrieving data, storing data, and performing mathematical calculations. Processors 20 are not limited by the materials from which they are formed, or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed and includes memory types such as read only memory (ROM), electronically erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display require- ments. Typically, a graphics card includes a graphics pro- cessing unit (GPU) and video RAM (VRAM) to accelerate display of graphics. One or more input/output (I/O) inter- faces 44 provide the necessary support for communications between computing device 10 and any external peripherals and accessories 60. For wireless communications, the nec- essary radio-frequency hardware and firmware may be con- nected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid-state memory technology. Non-volatile data storage devices 50 may store any type of data including, but not limited to, an operating system 51 for providing low-level and mid-level function- ality of computing device 10, applications 52 for providing high-level functionality of computing device 10, program modules 53 such as containerized programs or applications, or other modular content or modular programming, appli- cation data 54, and databases 55 such as relational databases, non-relational databases, object oriented databases, BOSQL databases, and graph databases.

Applications (also known as computer software or soft- ware applications) are sets of programming instructions designed to perform specific tasks or provide specific func- tionality on a computer or other computing devices. Appli- cations are typically written in high-level programming languages such as C++, Java, and Python, which are then either interpreted at runtime or compiled into low-level, binary, processor-executable instructions operable on pro- cessors 20. Applications may be containerized so that they can be run on any computer hardware running any known operating system. Containerization of computer software is a method of packaging and deploying applications along with their operating system dependencies into self-con- tained, isolated units known as containers. Containers pro- vide a lightweight and consistent runtime environment that allows applications to run reliably across different comput- ing environments, such as development, testing, and pro- duction systems.

The memories and non-volatile data storage devices described herein do not include communication media. Communication media are means of transmission of infor- mation such as modulated electromagnetic waves or modu- lated data signals configured to transmit, not store, informa- tion. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing devices and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data commu- nications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external com- munication devices 70 are possible. Using external commu- nication devices 70, networks may be configured as local area networks (LANs) for a single location, building, or campus, wide area networks (WANs) comprising data net- works that extend over a larger geographical area, and virtual private networks (VPNs) which can be of any size but connect computers via encrypted communications over pub- lic networks such as the Internet 75. As just one exemplary network configuration, network interface 42 may be con- nected to switch 73 which is connected to router 72 which is connected to modem 71 which provides access for com- puting device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hard- ware that is specifically designed for servers may be employed. For example, secure socket layer (SSL) accel- eration cards can be used to offload SSL encryption com- putations, and transmission control protocol/internet proto- col (TCP/IP) offload hardware and/or packet classifiers on network interfaces 42 may be installed and used at server devices.

In a networked environment, certain components of com- puting device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to comput- ing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is Docker, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containerd or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Github Packages or Container registries. Containers can communicate with each other and the external world through networking. Docker provides a bridge network by default but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services.

Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, gRPC, or message queues such as Kafka. Microservices 91 can be combined to perform more complex processing tasks.

Cloud computing services 92 are delivery of computing resources and services over the Internet 75 from a remote location. Cloud computing services 92 provide additional computer hardware and storage on as needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions.

The skilled person will be aware of a range of possible modifications of the various aspects described above. Accordingly, the present invention is defined by the claims and their equivalents.

What is claimed is:

1. A system for multi-type data compression or decompression with a virtual management layer in a distributed computing environment, comprising:

a plurality of computing devices, each comprising at least a memory and a processor;

a plurality of programming instructions stored in the memory and operable on the processor of each computing device, wherein the plurality of programming instructions, when operating on the processors, cause the computing devices to:

organize a plurality of incoming data types into a plurality of data sets in a virtual management layer, wherein the virtual management layer categorizes each set of incoming data into a particular type and selects a compression or decompression technique to maximize efficiency for that particular data type;

flag associated data sets as similar before they enter the compression or decompression process;

dynamically allocate a compression or decompression system for each data set across the plurality of physically separate computing devices based on current processing capacity and workload for each computing device;

process the plurality of data sets through each data set's corresponding compression or decompression system where the compression or decompression system outputs a plurality of compressed or decompressed data sets by performing parallel processing of different data sets on different computing devices simultaneously;

merge data that has been marked as associated back together after compression or decompression has taken place, regardless of which computing devices performed the compression or decompression; and output the plurality of compressed or decompressed data sets to a desired output location.

2. The system of claim 1, wherein the virtual management layer is configured to distribute the processing of data sets across the plurality of computing devices based on available resources and processing requirements.

3. The system of claim 1, wherein a plurality of associated data sets may be flagged or marked as similar before entering the compression or decompression system by a data manager.

4. The system of claim 3, wherein the plurality of associated data sets that have been flagged or marked are regrouped together in a compressed or decompressed data manager after compression or decompression has taken place, regardless of which computing device performed the compression or decompression.

5. The system of claim 1, further comprising a load balancing module configured to dynamically allocate processing tasks among the plurality of computing devices based on their current workload and capacity.

6. The system of claim 1, further comprising implementing fault tolerance by replicating critical data across multiple computing devices in the distributed system.

7. A method for distributed multi-type data compression or decompression with a virtual management layer in a distributed computing environment, comprising:

organizing a plurality of incoming data types into a plurality of data sets in a virtual management layer, wherein the virtual management layer categorizes each set of incoming data into a particular type and selects a compression or decompression technique to maximize efficiency for that particular data type;

flagging associated data sets as similar before they enter the compression or decompression process;

dynamically allocating, by the virtual management layer, a compression or decompression system for each data set across a plurality of physically separate computing devices based on current processing capacity and workload for each computing device;

processing the plurality of data sets through each data set's corresponding compression or decompression system where the compression or decompression system outputs a plurality of compressed or decompressed data sets by performing parallel processing of different data sets on different computing devices simultaneously;

merging data that has been marked as associated back together after compression or decompression has taken place, regardless of which computing devices performed the compression or decompression; and outputting the plurality of compressed or decompressed data sets to a desired output location.

8. The method of claim 7, further comprising distributing the processing of data sets across the plurality of computing devices based on available resources and processing requirements.

9. The method of claim 7, wherein a plurality of associated data sets may be flagged or marked as similar before entering the compression or decompression system by a data manager.

10. The method of claim 9, wherein the plurality of associated data sets that have been flagged or marked are regrouped together in a compressed or decompressed data manager after compression or decompression has taken place, regardless of which computing device performed the compression or decompression.

11. The method of claim 7, further comprising dynamically allocating processing tasks among the plurality of computing devices based on their current workload and capacity.

12. The method of claim 7, further comprising implementing fault tolerance by replicating critical data across multiple computing devices in the distributed system.

* * * * *